US009685619B2

(12) United States Patent
Van Der Boom et al.

(10) Patent No.: US 9,685,619 B2
(45) Date of Patent: Jun. 20, 2017

(54) LOGIC CIRCUITS WITH PLUG AND PLAY SOLID-STATE MOLECULAR CHIPS

(71) Applicant: YEDA RESEARCH AND DEVELOPMENT CO. LTD., Rehovot (IL)

(72) Inventors: Milko E. Van Der Boom, Rishon Lezion (IL); Graham De Ruiter, Rehovot (IL)

(73) Assignee: YEDA RESEARCH AND DEVELOPMENT CO. LTD., Rehovot (IL)

( * ) Notice: Subject to any disclaimer, the term of this patent is extended or adjusted under 35 U.S.C. 154(b) by 0 days.

(21) Appl. No.: 14/413,885

(22) PCT Filed: Jul. 9, 2013

(86) PCT No.: PCT/IL2013/050584
§ 371 (c)(1),
(2) Date: Jan. 9, 2015

(87) PCT Pub. No.: WO2014/009952
PCT Pub. Date: Jan. 16, 2014

(65) Prior Publication Data
US 2015/0171352 A1 Jun. 18, 2015

Related U.S. Application Data

(60) Provisional application No. 61/669,267, filed on Jul. 9, 2012.

(51) Int. Cl.
H01L 51/00 (2006.01)
H01L 51/05 (2006.01)
(Continued)

(52) U.S. Cl.
CPC .......... H01L 51/0088 (2013.01); H01L 27/28 (2013.01); H01L 51/0595 (2013.01);
(Continued)

(58) Field of Classification Search
CPC . H01L 27/28; H01L 51/0067; H01L 51/0088; H01L 51/0595; H03K 19/20; H03K 19/21
See application file for complete search history.

(56) References Cited

U.S. PATENT DOCUMENTS 5,009,958 A 4/1991 Yamashita et al.
5,648,508 A 7/1997 Yaghi
(Continued)

FOREIGN PATENT DOCUMENTS

EP 0709253 5/1996
WO WO 01/03126 1/2001
(Continued)

OTHER PUBLICATIONS

Andreasson, Joakim and Pischel, Uwe, Smart molecules at work-mimicking advanced logic operations, 2010.1039, The Royal Society of Chemistry, vol. 39, pp. 174-188.*
(Continued)

*Primary Examiner* — Alexander H Taningco
*Assistant Examiner* — Kurtis R Bahr
(74) *Attorney, Agent, or Firm* — Mark S. Cohen; Pearl Cohen; Zedek Latzer Baratz LLP

(57) ABSTRACT

A logic circuit for performing a logic operation comprising a plurality of predetermined solid-state molecular chips, each molecular chip having multiple states obtained after application of a corresponding input. After applying predetermined inputs on the molecular chips, reading the states of the molecular chips produces a logical output according to the logic operation.

29 Claims, 7 Drawing Sheets

(51) Int. Cl.
*H01L 27/28* (2006.01)
*H03K 19/20* (2006.01)
*H03K 19/21* (2006.01)

(52) U.S. Cl.
CPC ............. *H03K 19/20* (2013.01); *H03K 19/21* (2013.01); *H01L 51/0067* (2013.01)

(56) References Cited

U.S. PATENT DOCUMENTS

| | | | |
|---|---|---|---|
| 5,818,636 | A | 10/1998 | Leventis et al. |
| 6,198,655 | B1 | 3/2001 | Heath et al. |
| 6,208,553 | B1 | 3/2001 | Gryko et al. |
| 6,212,093 | B1 | 4/2001 | Lindsey |
| 6,430,511 | B1* | 8/2002 | Tour ................ B82Y 10/00 435/6.11 |
| 6,624,318 | B1 | 9/2003 | Muller et al. |
| 6,696,285 | B1* | 2/2004 | Mills, Jr. ............ B82Y 5/00 422/129 |
| 6,728,129 | B2 | 4/2004 | Lindsey et al. |
| 6,824,837 | B2 | 11/2004 | Abbott et al. |
| 7,637,983 | B1 | 12/2009 | Liu et al. |
| 7,781,756 | B2* | 8/2010 | Darsey ............ B82Y 10/00 257/40 |
| 7,799,120 | B2 | 9/2010 | Yaghi et al. |
| 8,110,353 | B2* | 2/2012 | Zhang ............. C12Q 1/682 435/6.1 |
| 2004/0159835 | A1 | 8/2004 | Krieger et al. |
| 2004/0175631 | A1 | 9/2004 | Crocker et al. |
| 2005/0243597 | A1 | 11/2005 | Gallo et al. |
| 2007/0072215 | A1* | 3/2007 | Seelig ............. B82Y 10/00 435/6.11 |
| 2007/0108438 | A1 | 5/2007 | Lindsey |
| 2007/0258147 | A1* | 11/2007 | Van Der Boom ... H01G 9/2059 359/599 |
| 2008/0219041 | A1* | 9/2008 | Kuhr ............... B82Y 10/00 365/151 |
| 2009/0275027 | A1* | 11/2009 | MacDonald ....... C12Q 1/6823 435/6.11 |
| 2010/0006794 | A1 | 1/2010 | Hawkins et al. |
| 2010/0118598 | A1 | 5/2010 | Hawkins et al. |
| 2010/0197006 | A1* | 8/2010 | Benenson ......... B82Y 10/00 435/325 |
| 2013/0148413 | A1* | 6/2013 | Van Der Boom ...... G11C 11/54 365/151 |
| 2014/0196180 | A1 | 7/2014 | Van Der Boom et al. |
| 2015/0007371 | A1 | 1/2015 | Van Der Boom et al. |
| 2015/0171352 | A1 | 6/2015 | Van Der Boom et al. |

FOREIGN PATENT DOCUMENTS

| | | |
|---|---|---|
| WO | WO 01/52266 A1 | 7/2001 |
| WO | WO 03/038886 | 5/2003 |
| WO | WO 2009/095924 | 8/2009 |
| WO | 2011141913 A1 | 11/2011 |
| WO | WO 2014/061018 A2 | 4/2014 |
| WO | WO 2015/075714 A1 | 5/2015 |

OTHER PUBLICATIONS

Graham de Ruiter et al; "Sequential Logic Operations with Surface-Confined Polypyridyl Complexes Displaying Molecular Random Access Memory Features" Angewandte Chemie vol. 49 No. 1 pp. 169-172. (2010).
Abruna et al. "Rectifying Interfaces Using Two-Layer Films of Electrochemically Polymerized Vinylpyridine and Vinylbipyridine Complexes of Ruthenium and Iron on Electrodes", Journal of the American Chemical Society, vol. 103, No. 1 Jan. 4, 1981.
Alexeev et al. "Coordination motifs in modern supramolecular chemistry", Coordination Chemistry Reviews, vol. 254, Issues 7-8, Apr. 2010, pp. 794-831.
Altman et al. "Controlling structure from the bottom-up: structural and optical properties of layer-by-layer assembled palladium coordination-based multilayers", J Am Chem Soc. Jun. 7, 2006;128(22):7374-82.
Altman et al. "Molecular assembly of a 3D-ordered multilayer", J Am Chem Soc. Apr. 16, 2008;130(15):5040-1.
Altman et al. "Designing surface-confined coordination oligomers", Chemistry. Jun. 18, 2010;16(23):6744-7.
Alvarado et al. "Self-assembling bipyridinium multilayers", J Phys Chem B. Apr. 7, 2005;09(13):6164-73.
Amelia et al. "Signal processing with multicomponent systems based on metal complexes", Coordination Chemistry Reviews 254 (2010) 2267-2280.
Amoroso et al. "Di-, Tri-, and Tetranucleating Pyridyl Ligands Which Facilitate Multicenter Magnetic Exchange between Paramagnetic Molybdenum Centers", norg. Chem., 1995,34 (19), pp. 4828-4835.
Anderson et al. "Acetonitrile Complexes of Selected Transition Metal Cations", Inorg. Synth., 1990,28,60-63.
Andreasson et al. "Smart molecules at work—mimicking advanced logic operations", Chem Soc Rev. Jan. 2010;39(1):174-88.
Andreasson et al. "All-photonic multifunctional molecular logic device", J Am Chem Soc. Aug. 3, 2011;133(30):11641-8.
Andres et al. "Inkjet deposition of layer-by-layer assembled films", J Am Chem Soc. Oct. 20, 2010;132(41):14496-502.
Araki et al. "Rectifying properties and photoconductivity of tetraruthenated nickel porphyrin films", vol. 7, Issue 6 Jun. 1995 pp. 554-559.
Ariga et al. "Layer-by-layer assembly as a versatile bottom-up nanofabrication technique for exploratory research and realistic application", Phys Chem Chem Phys. May 21, 2007;9(19):2319-40.
Ariga et al. "Forming nanomaterials as layered functional structures toward materials nanoarchitectonics", NPG Asia Materials (2012) 4, e17.
Avellini et al. "Photoinduced memory effect in a redox controllable bistable mechanical molecular switch", Angew Chem Int Ed Engl. Feb. 13, 2012;51(7):1611-5.
Ball et al. "Chemistry meets computing", Nature. Jul. 13, 2000;406(6792):118-20.
Balzani et al. "Processing energy and signals by molecular and supramolecular systems", Chemistry. 2008;14(1):26-39.
Bard et al. "Electrochemical methods: Fundamentals and Applications", 2nd Ed. Wiley, Hoboken, NJ., 2001.
Batten et al. "Coordination polymers, metal—organic frameworks and the need for terminology guidelines", CrystEngComm, 2012,14, 3001-3004.
Beck et al. "Multistimuli, multiresponsive metallo-supramolecular polymers", J Am Chem Soc. Nov. 19, 2003;125(46):13922-3.
Beley et al. "Luminescent Dinuclear Complexes Containing Ruthenium(II)- and Osmium(II)-Terpyridine-type Chromophores Bridged by a Rigid Biscyclometalating Ligand", Inorg. Chem., 1994, 33 (12), pp. 2543-2547.
Berchmans et al. "Diode like electron transfer in mixed monolayer assembly", J. Mater. Chem., 2002,12, 2538-2542.
Bodenthin et al. "Inducing spin crossover in metallo-supramolecular polyelectrolytes through an amphiphilic phase transition", J Am Chem Soc. Mar. 9, 2005;127(9):3110-4.
Boiko et al. "Surface segregation in blends of miscible amorphous polymers", Colloid and Polymer Science Jun. 2013, vol. 291, Issue 6, pp. 1519-1523.
Borje et al. "A new bridging ligand for the synthesis of luminescent polynuclear Ru(II) and Os(II) polypyridine complexes", New J. Chem., 2001,25, 191-193.
Braga et al. "Rates of electron transfer from osmium(II) to iron(III) complex ions containing 2,2'-bipyridine or its derivatives as ligands. Effects of electrolytes at low concentrations and reactant-separation distance", J. Phys. Chem., 1985, 89 (26), pp. 5822-5828.
Braterman et al. "Electronic absorption spectra of the iron(II) complexes of 2,2'-bipyridine, 2,2'-bipyrimidine, 1,10-phenanthroline, and 2,2':6',2"-terpyridine and their reduction products", Inorg. Chem., 1992, 31 (4), pp. 555-559.

(56) References Cited

OTHER PUBLICATIONS

Bryant et al. "Charge-transfer and intraligand electronic spectra of bipyridyl complexes of iron, ruthenium, and osmium. I. Bivalent complexes", Australian Journal of Chemistry 24(2) 257-273 , 1971.
Buda et al. "Thin-film solid-state electroluminescent devices based on tris(2,2'-bipyridine)ruthenium(II) complexes", J Am Chem Soc. May 29, 2002;124(21):6090-8.
Burdeniuk et al. "Polarizable stilbazole-based organometallic complexes and polymers", Journal of Organometallic Chemistry vol. 451, Issues 1-2, Jun. 1, 1993, pp. 213-220.
Cameron et al. "Metal-Metal Interactions in a Novel Hybrid Metallopolymer", J. Am. Chem. Soc., 1999, 121 (50), pp. 11773-11779.
Campagna et al. "Photochemistry and Photophysics of Coordination Compounds: Ruthenium", Topics in Current Chemistry vol. 280, 2007, pp. 117-214, 2007.
Campbell et al. "Cascading transformations within a dynamic self-assembled system", Nat Chem. Aug. 2010;2(8):684-7.
Carroll et al. "The genesis of molecular electronics", Angew Chem Int Ed Engl. Dec. 2, 2002;41(23):4378-400.
Cerclier et al. "Elaboration of spin-coated cellulose-xyloglucan multilayered thin films", Langmuir. Nov. 16, 2010;26(22):17248-55.
Chen et al. "Interwoven metal-organic framework on a periodic minimal surface with extra-large pores", Science. Feb. 9, 2001;291(5506):1021-3.
Chidsey et al. "Electroactive polymers and macromolecular electronics", Science Jan. 3, 1986;231(4733):25-31.
Choudhury et al. "Linear vs exponential formation of molecular-based assemblies", J Am Chem Soc. Jul. 14, 2010;132(27):9295-7.
Chu et al. "Sensitive single-layered oxygen-sensing systems: polypyridyl ruthenium(II) complexes covalently attached or deposited as langmuir-blodgett monolayer on glass surfaces", Langmuir. Aug. 15, 2006;22(17):7437-43.
Collier et al. "A [2]Catenane-Based Solid State Electronically Reconfigurable Switch", Science. Aug. 18, 2000;289(5482)1172-5.
Connelly et al. "Chemical Redox Agents for Organometallic Chemistry", Chem Rev. Mar. 28, 1996;96(2):877-910.
Cook et al. "Metal-organic frameworks and self-assembled supramolecular coordination complexes: comparing and contrasting the design, synthesis, and functionality of metal-organic materials", Chem Rev. Jan. 9, 2013;113(1):734-77.
De Hatten et al. "Aqueous self-assembly of an electroluminescent double-helical metallopolymer", J Am Chem Soc. Nov. 21, 2012;134(46):19170-8.
Delongchamp et al. "High-Contrast Electrochromism from Layer-By-Layer Polymer Films", Chem. Mater., 2003, 15 (8), pp. 1575-1586.
Delongchamp et al. "High-Contrast Electrochromism and Controllable Dissolution of Assembled Prussian Blue/Polymer Nanocomposites", Advanced Functional Materials vol. 14, Issue 3, pp. 224-232, Mar. 2004.
Demas et al. "Quantum Efficiencies on Transition Metal Complexes. Charge-Transfer Luminescence", Journal of the American Chemical Society 1 93:12 / Jun. 16, 1971.
Deng et al. "Multiple functional groups of varying ratios in metal-organic frameworks", Science. Feb. 12, 2010;327(5967):846-50.
Denisevich et al. "Unidirectional Current Flow and Charge State Trapping at Redox Polymer Interfaces on Bilayer Electrodes: Principles, Experimental Demonstration, and Theory", J. Am. Chem. SOC. 1981, 103,4127-4131.
De Ruiter et al. "Selective Optical Recognition and Quantification of Parts Per Million Levels of Cr6+ in Aqueous and Organic Media by Immobilized Polypyridyl Complexes on Glass", J. Am. Chem. Soc., 2008, 130 (9), pp. 2744-2745.
De Ruiter et al. "Electrically addressable multistate volatile memory with flip-flop and flip-flap-flop logic circuits on a solid support", Angew Chem Int Ed Engl. Jun. 28, 2010;49(28):4780-3.
De Ruiter et al. "Polymeric memory elements and logic circuits that store multiple bit states", ACS Appl Mater Interfaces. Dec. 2010;2(12):3578-85.
De Ruiter et al. "Surface-confined assemblies and polymers for molecular logic", Acc Chem Res. Aug. 16, 2011;44(8):563-73.
De Ruiter et al. "Sequential logic and random access memory (RAM): a molecular approach", J. Mater. Chem., 2011,21, 17575-17581.
De Ruiter et al. "Orthogonal addressable monolayers for integrating molecular logic", Angew Chem Int Ed Engl. Aug. 20, 2012;51(34):8598-601.
De Ruiter et al. "Sequence-dependent assembly to control molecular interface properties", Angew Chem Int Ed Engl. Jan. 7, 2013;52(2):704-9.
De Silva "Luminescent Photoinduced Electron Transfer (PET) Molecules for Sensing and Logic Operations", J. Phys. Chem. Lett., 2011, 2 (22), pp. 2865-2871.
De Silva et al. "A molecular photoionic AND gate based on fluorescent signaling", Nature 364, 42-44 (Jul. 1, 1993).
Desiraju "Crystal engineering: a holistic view", Angew Chem Int Ed Engl. 2007;46(44):8342-56.
Dibenedetto et al. "Charge conduction and breakdown mechanisms in self-assembled nanodielectrics", J Am Chem Soc. May 27, 2009;131(20):7158-68.
Doherty et al. "Speciation of iron(II) and iron(III) using a dual electrode modified with electrocatalytic polymers", Anal. Chem., 1992, 64 (5), pp. 572-575.
Doron-Mor et al. "Controlled surface charging as a depth-profiling probe for mesoscopic layers", Nature. Jul. 27, 2000;406(6794):382-5.
Eddaoudi et al. "Design and synthesis of metal-carboxylate frameworks with permanent microporosity", Topics in Catalysis Jul. 1999, vol. 9, Issue 1, pp. 105-111.
Evmenenko et al. "Specular x-ray reflectivity study of ordering in self-assembled organic and hybrid organic—inorganic electro-optic multilayer films", J. Chem. Phys. 115, 6722 (2001).
Evmenenko et al. "Morphological behavior of thin polyhedral oligomeric silsesquioxane films at the molecular scale", J Colloid Interface Sci. Aug. 15, 2011;360(2):793-9.
Fabre "Ferrocene-terminated monolayers covalently bound to hydrogen-terminated silicon surfaces. Toward the development of charge storage and communication devices", Acc Chem Res. Dec. 21, 2010;43(12):1509-18.
Facchetti et al. "Very large electro-optic responses in H-bonded heteroaromatic films grown by physical vapour deposition", Nat Mater. Dec. 2004;3(12):910-7.
Fang et al. "Structural Changes in Self-Assembled Monolayers Induced by Photodimerization: A Scanning Force Microscopy Investigation", Langmuir, 2001, 17 (5), pp. 1549-1551.
Finklea et al. "Electron-transfer kinetics in organized thiol monolayers with attached pentaammine(pyridine)ruthenium redox centers", J. Am. Chem. Soc., 1992, 114 (9), pp. 3173-3181.
Fioravanti et al. "Three state redox-active molecular shuttle that switches in solution and on a surface", J Am Chem Soc. Feb. 27, 2008;130(8):2593-601.
Forster et al. "Kinetic Separation of Faradaic Currents: Binary Monolayers as Model Systems", Anal. Chem., 1995, 67 (7), pp. 1232-1239.
Frattarelli et al. "Self-assembly from the gas-phase: design and implementation of small-molecule chromophore precursors with large nonlinear optical responses", J Am Chem Soc. Sep. 9, 2009;131(35):12595-612.
Freys et al. "Ru-based donor-acceptor photosensitizer that retards charge recombination in a p-type dye-sensitized solar cell", Dalton Trans. Nov. 14, 2012;41(42):13105-11.
Friese et al. "Soluble dynamic coordination polymers as a paradigm for materials science", Coordination Chemistry Reviews vol. 252, Issues 1-2, Jan. 2008, pp. 199-211.
Fujita et al. "Singlet-Triplet Charge-Transfer Absorption Spectrum of Tris(2,2'-bipyridine)osmium(II) Complex", Zeitschrift für Physikalische Chemie, vol. 79, Issue 5_6 (Jul. 1972).
Gantz et al. "The Digital Universe Decade—Are You Ready" International Data Corporation (IDC), pp. 1-16, 2010.

(56) References Cited

OTHER PUBLICATIONS

Gao et al. "Progressive release of a palladium-pyridyl complex from a layer-by-layer multilayer and illustrative application to catalytic Suzuki coupling", Chem Commun (Camb). Oct. 28, 2010;46(40):7584-6.
Garcia-Canadas et al. "Electrochromic switching in the visible and near IR with a Ru-dioxolene complex adsorbed on a nanocrystalline SnO2electrode", Electrochemistry Communications vol. 5, Issue 5, May 2003, pp. 416-420.
Gauthier et al. "Silicon Surface-Bound Redox-Active Conjugated Wires Derived from Mono- and Dinuclear Iron(II) and Ruthenium(II) Oligo(phenyleneethynylene) Complexes", vol. 20, Issue 10 May 19, 2008, pp. 1952-1956.
Givaja et al. "Electrical conductive coordination polymers", Chem Soc Rev. Jan. 7, 2012;41(1):115-47.
Green et al. "A 160-kilobit molecular electronic memory patterned at 10(11) bits per square centimeter", Nature. Jan. 25, 2007;445(7126):414-7.
Gulino et al. "Structural and electronic characterization of self-assembled molecular nanoarchitectures by X-ray photoelectron spectroscopy", Anal Bioanal Chem. Feb. 2013;405(5):1479-95.
Gulino et al. "Spectroscopic and Microscopic Characterization and Behavior of an Optical pH Meter Based on a Functional Hybrid Monolayer Molecular System: Porphyrin Molecules Covalently Assembled on a Molecularly Engineered Silica Surface", Chem. Mater., 2006, 18 (9), pp. 2404-2410.
Gulino et al. "Optical pH Meter by Means of a Porphyrin Monolayer Covalently Assembled on a Molecularly Engineered Silica Surface", Chem. Mater., 2005, 16, pp. 4043-4045.
Gupta et al. "Optical sensing of parts per million levels of water in organic solvents using redox-active osmium chromophore-based monolayers", J Am Chem Soc. Jul. 5, 2006;128(26):8400-1.
Gupta et al. "Covalent Assembled Osmium-Chromophore-Based Monolayers: Chemically Induced Modulation of Optical Properties in the Visible Region", Chem. Mater., 2006, 18 (6), pp. 1379-1382.
Ha et al. "Solution-deposited organic-inorganic hybrid multilayer gate dielectrics. Design, synthesis, microstructures, and electrical properties with thin-film transistors", J Am Chem Soc. Jul. 6, 2011;133(26):10239-50.
Haag et al. "Electrical Breakdown of Aliphatic and Aromatic Self-Assembled Monolayers Used as Nanometer-Thick Organic Dielectrics", J. Am. Chem. Soc. 1999, 121, 7895-7906.
Handy et al. "Solid-State Light-Emitting Devices Based on the Tris-Chelated Ruthenium(II) Complex. 2. Tris(bipyridyl)ruthenium(II) as a High-Brightness Emitter", J. Am. Chem. Soc., 1999, 121 (14), pp. 3525-3528.
Hilbert et al. "The world's technological capacity to store, communicate, and compute information", Science. Apr. 1, 2011;332(6025):60-5.
Hirao, T., Redox Systems Under Nano-Space Control; Springer-Verlag: Heidelberg, 2006.
Hjelm et al. "Conducting polymers containing in-chain metal centers: electropolymerization of oligothienyl-substituted {M(tpy)2} complexes and in situ conductivity studies, M = Os(II), Ru(II)", Inorg Chem. Feb. 21, 2005;44(4):1073-81.
Hoertz et al. "Light-to-chemical energy conversion in lamellar solids and thin films", Inorg Chem. Oct. 3, 2005;44(20):6828-40.
Holmlin et al. "Electron transport through thin organic films in metal-insulator-metal junctions based on self-assembled monolayers", J Am Chem Soc. May 30, 2001;123(21):5075-85.
International Search Report for PCT Application No. PCT/IL2013/050584 mailed Aug. 25, 2014.
Jandrasics et al. "Synthesis and properties of mononuclear tris(heteroleptic)osmium(II) complexes containing bidentate polypyridylligands", J. Chem. Soc., Dalton Trans., 1997, 153-160.
Juris et al. "Ru(II) polypyridine complexes: photophysics, photochemistry, eletrochemistry, and chemiluminescence", Coordination Chemistry Reviews vol. 84, Mar. 1988, pp. 85-277.
Kaminker et al. "Stepwise assembly of coordination-based metal-organic networks", J Am Chem Soc. Oct. 20, 2010;132(41):14554-61.
Kanaizuka et al. "Construction of highly oriented crystalline surface coordination polymers composed of copper dithiooxamide complexes", J Am Chem Soc. Nov. 26, 2008;130(47):15778-9.
Katz et al. "Polar orientation of dyes in robust multilayers by zirconium phosphate-phosphonate interlayers", Science. Dec. 6, 1991;254(5037):1485-7.
Katz et al. "Kinetic Separation of Amperometric Responses of Composite Redox-Active Monolayers Assembled onto Au Electrodes: Implications to the Monolayers' Structure and Composition", Langmuir, 1997, 13 (13), pp. 3364-3373.
Kiessig "Annalen Der Physik", Ann. Phys. (Leipzig), 1931, 10, 769-788.
Kim et al. "Noncovalently Linked Zinc Porphyrin-Ru(bpy)3 Dyad Assembled via Axial Coordination", Bulletin of the Korean Chemical Society vol. 24, Issue 10, 2003, pp. 1490-1494.
Kitagawa et al. "Dynamic porous properties of coordination polymers inspired by hydrogen bonds", Chem Soc Rev. Feb. 2005;34(2):109-19.
Klauk et al. "Ultralow-power organic complementary circuits", Nature. Feb. 15, 2007;445(7129):745-8.
Kumar et al. "Patterned Self-Assembled Monolayers and Meso-Scale Phenomena", Acc. Chem. Res., 1995, 28 (5), pp. 219-226.
Kumaresan et al. "Photochemistry and Photophysics of Coordination Compounds: Osmium", Photochemistry and Photophysics of Coordination Compounds II vol. 281 of the series Topics in Current Chemistry pp. 101-142, 2007.
Kurita et al. "Surface Junction Effects on the Electron Conduction of Molecular Wires", J. Am. Chem. Soc., 2010, 132 (13), pp. 4524-4525.
Lahann et al. "A reversibly switching surface", Science. Jan. 17, 2003;299(5605):371-4.
Lauters et al. "Multilevel conductance switching in polymer films", Appl. Phys. Lett. 89, 013507 (2006).
Lee et al. "Adsorption of ordered zirconium phosphonate multilayer films on silicon and gold surfaces", J. Phys. Chem., 1988, 92 (9), pp. 2597-2601.
Lee et al. "Multilevel data storage memory devices based on the controlled capacitive coupling of trapped electrons", Adv Mater. May 10, 2011;23(18):2064-8.
Lee et al. "Organosilicate thin film containing Ru(bpy)32+ for an electrogenerated chemiluminescence (ECL) sensor", Chem. Commun., 2003, 1602-1603.
Lehn, J.M., Supramolecular Chemistry: Concepts and Perspectives, Chapter 7: pp. 81-88, Chapter 8: pp. 89-138, Chapter 9: pp. 139-197; Wiley—VCH: Weinheim, Germany, 1995.
Lehn "Toward self-organization and complex matter", Science. Mar. 29, 2002;295(5564):2400-3.
Leidner et al. "Estimation of the rate of electron transfers between two contacting polymer surfaces", J. Am. Chem. Soc., 1985, 107 (3), pp. 551-556.
Lezama et al. "Single-crystal organic charge-transfer interfaces probed using Schottky-gated heterostructures", Nat Mater. Sep. 2012;11(9):788-94.
Li et al. "Porphyrin based self-assembled monolayer thin films: synthesis and characterization", J. Am. Chem. Soc., 1993, 115 (15), pp. 6975-6980.
Li et al. "Self-Assembled Monolayers of 7-(10-Thiodecoxy)coumarin on Gold: Synthesis, Characterization, and Photodimerization", J. Am. Chem. Soc., 1997, 119 (31), pp. 7211-7217.
Li et al. "A small-molecule-based ternary data-storage device", J Am Chem Soc. Apr. 28, 2010;132(16):5542-3.
Li et al. "Multibit Memory Using Self-Assembly of Mixed Ferrocene/Porphyrin Monolayers on Silicon", Advanced Materials, vol. 16, Issue 2 Jan. 2004 pp. 133-137.
Li et al. "Design and synthesis of an exceptionally stable and highly porous metal-organic framework", Nature 402, 276-279 (Nov. 18, 1999).

(56) References Cited

OTHER PUBLICATIONS

Li et al. "Capacitance and conductance characterization of ferrocene-containing self-assembled monolayers on silicon surfaces for memory applications", Appl. Phys. Lett. 81, 1494 (2002).
Liang et al. "Coordination chemistry at a surface: polymetallic complexes prepared on quartz by alternate deposition of iron(II) and ruthenium(II) centres", J. Chem. Soc., Chem. Commun., 1995, 1007-1008.
Lieber "The incredible shrinking circuit", Sci Am. Sep. 2001;285(3):58-64.
Lindsey et al. "Molecules for charge-based information storage", Acc Chem Res. Aug. 16, 2011;44(8):638-50.
Liu et al. "A Thin-Film Electrochromic Device Based on a Polyoxometalate Cluster", Adv. Mater. 2002, 14, No. 3, Feb. 5.
Liu et al. "Molecular memories that survive silicon device processing and real-world operation", Science. Nov. 28, 2003;302(5650):1543-5.
Loi et al. "Supramolecular organization in ultra-thin films of α-sexithiophene on silicon dioxide", Nature Materials 4, 81-85 (2005).
Lonergan "A tunable diode based on an inorganic Semiconductor Conjugated polymer interface", Science. Dec. 19, 1997;278(5346)2103-6.
MacGillivray et al. "Supramolecular Control of Reactivity in the Solid State Using Linear Molecular Templates", *J. Am. Chem. Soc.*, 2000, 122 (32), pp. 7817-7818.
Maeda et al. "Metal complex oligomer and polymer wires on electrodes: Tactical constructions and versatile functionalities", Polymer 54 (2013) 4383e4403.
Makiura et al. "Surface nano-architecture of a metal-organic framework", Nat Mater. Jul. 2010;9(7):565-71.
Maoz et al. "Hydrogen-bonded muttilayers of self-assembling silanes: structure elucidation by combined Fourier transform infrared spectroscopy and X-ray scattering techniques", Supramol. Scl, 1995, 2, 9-24.
McGehee et al. "Solar cells: Pictures from the blended zone", Nat Mater. Sep. 2006;5(9):675-6.
McMahon et al. "Surface enhanced raman scattering and photodimerization of pyridyl-substituted ethylenes at a silver electrode surface", Surface Science vol. 158, Issues 1-3, Jul. 3, 1985, pp. 381-392.
Mentes et al. "Tris(2,20-bipyridine-j2 N,N0)cobalt(II) bis(hexafluoridophosphate)", Acta Cryst. (2013). E69, m58.
Merzlikin et al. "Resolving the depth coordinate in photoelectron spectroscopy—Comparison of excitation energy variation vs. angular-resolved XPS for the analysis of a self-assembled monolayer model system", Surface Science vol. 602, Issue 3, Feb. 1, 2008, pp. 755-767.
Min et al. "Electrochemical biomemory device consisting of recombinant protein molecules", Biotechnology and Bioprocess Engineering Feb. 2010, vol. 15, Issue 1, pp. 30-39.
Miyashita et al. "Directing supramolecular assemblies on surfaces", J. Mater. Chem., 2008,18, 2636-2649.
Mondal et al. "Bottom-Up Assembly of Multicomponent Coordination-Based Oligomers", J. Phys. Chem. C 2011, 115, 16398-16404.
Motiei et al. "Self-propagating assembly of a molecular-based multilayer", J Am Chem Soc. Jul. 16, 2008;130(28):8913-5.
Motiei et al. "Electrochemical Characteristics of a Self-Propagating Molecular-Based Assembly", J. Phys. Chem. B 2010, 114, 14283-14286.
Motiei et al. "Electrochromic behavior of a self-propagating molecular-based assembly", J Am Chem Soc. Mar. 18, 2009;131(10):3468-9.
Motiei et al. "Self-propagating molecular assemblies as interlayers for efficient inverted bulk-heterojunction solar cells", J Am Chem Soc. Sep. 15, 2010;132(36):12528-30.
Motiei et al. "Controlling growth of self-propagating molecular assemblies", Chem. Sci., 2012,3, 66-71.
Motiei et al. "Synergism in multicomponent self-propagating molecular assemblies", Langmuir. Feb. 15, 2011;27(4):1319-25.
Motiei et al. "Molecule and electron transfer through coordination-based molecular assemblies", J Am Chem Soc. Sep. 14, 2011;133(36):14264-6.
Mukherjee et al. "Tuning of Molecular Rectification in Donor/Acceptor Assemblies via Supramolecular Structures", Chem. Mater., 2006, 18 (14), pp. 3302-3307.
Naciri et al. "Photosensitive Triethoxysilane Derivatives for Alignment of Liquid Crystals", Chem. Mater., 2000, 12 (11), pp. 3288-3295.
Nair et al. "Multiresponsive Reversible Polymer Networks Based on Hydrogen Bonding and Metal Coordination", Macromolecules 2011, 44, 3346-3357.
Nesher et al. "Effect of chemical bond type on electron transport in GaAs-chemical bond-alkyl/Hg junctions", J Am Chem Soc. Jan. 31, 2007;129(4):734-5.
Netzer et al. "A new approach to construction of artificial monolayer assemblies", J. Am. Chem. Soc., 1983, 105 (3), pp. 674-676.
Nishimori et al. "Synthesis of molecular wires of linear and branched bis(terpyridine)-complex oligomers and electrochemical observation of through-bond redox conduction", Chem Asian J. Mar. 5, 2007;2(3):367-76.
Nishimori et al. "Superior electron-transport ability of pi-conjugated redox molecular wires prepared by the stepwise coordination method on a surface", Chem Asian J. Aug. 3, 2009;4(8):1361-7.
Nitahara et al. "A photoelectronic switching device using a mixed self-assembled monolayer", J Phys Chem B. Mar. 10, 2005;109(9):3944-8.
Northrop et al. "Self-organization in coordination-driven self-assembly", Acc Chem Res. Oct. 20, 2009;42(10):1554-63.
Oh et al. "Electrochemical Rectification Using Mixed Monolayers of Redox-Active Ferrocenyl Dendrimers and n-Alkanethiols", Langmuir 2002, 18, 6981-6987.
O'Keeffe et al. "Frameworks for Extended Solids: Geometrical Design Principles", Journal of Solid State Chemistry 152, 3}20 (2000).
Ortiz et al. "High-k organic, inorganic, and hybrid dielectrics for low-voltage organic field-effect transistors", Chem Rev. Jan. 2010;110(1):205-39.
Palomaki et al. "A versatile molecular layer-by-layer thin film fabrication technique utilizing copper(I)-catalyzed azide-alkyne cycloaddition", Langmuir. Jun. 15, 2010;26(12):9677-85.
Park et al. "Determination of Reorganization Energy from the Temperature Dependence of Electron Transfer Rate Constant for Hydroquinone-tethered Self-assembled Monolayers (SAMs)", Bull. Korean Chem. Soc. 2006, vol. 27, No. 3 381.
Perl et al. "Microcontact Printing: Limitations and Achievements", Adv. Mater. 2009, 21, 2257-2268.
Piner et al. ""Dip-Pen" nanolithography", Science. Jan. 29, 1999;283(5402):661-3.
Ram et al. "Langmuir-Blodgett films of processable polyaniline", J. Phys. Chem., 1993, 97 (45), pp. 11580-11582.
Ram et al, "Case report—a neonate with nonimmune hydrops fetalis", Singapore Med J. Oct. 1993; 34(5):459-61.
Rampi et al. "A versatile experimental approach for understanding electron transport through organic materials", Chemical Physics 281 (2002) 373-391.
Rashid et al. "Hydrogen-bond-directed orientation in nonlinear optical thin films", Advanced Materials, vol. 15, No. 23, 2024-2027, 2003.
Remon et al. "An all-photonic molecule-based D flip-flop", J Am Chem Soc. Dec. 28, 2011;133(51):20742-5.
Reynal et al. "Ruthenium Polypyridyl Sensitisers in Dye Solar Cells Based on Mesoporous TiO2", European Journal of Inorganic Chemistry vol. 2011, Issue 29, pp. 4509-4526, Oct. 2011.
Ribas, J., Coordination Chemistry, Part 1 'Structure and Bonding' Chapter 1 "Bonding in Coordination Compounds"; Wiley—VCH Verlag: Weinheim, Germany, 2008.
Richardson et al. "Spectroelectrochemical sensing based on multimode selectivity simultaneously achievable in a single device. 13. Detection of aqueous iron by in situ complexation with 2,2'-bipyridine", Anal Chem. Jul. 15, 2002;74(14):3330-5.

(56) References Cited

OTHER PUBLICATIONS

Sassi et al. "Gray to colorless switching, crosslinked electrochromic polymers with outstanding stability and transmissivity from naphthalenediimmide-functionalized EDOT", Adv Mater. Apr. 17, 2012;24(15):2004-8.
Saveant "Electron hopping between localized sites: coupling with electroinactive counterion transport", J. Phys. Chem., 1988, 92 (5), pp. 1011-1013.
Saveant "Electron hopping between localized sites: effect of ion pairing on diffusion and migration; general rate laws and steady-state responses", J. Phys. Chem., 1988, 15, pp. 4526-4532.
Scheres et al. "Microcontact printing onto oxide-free silicon via highly reactive acid fluoride-functionalized monolayers", Small. Mar. 8, 2010;6(5):642-50.
Schmidt "Photodimerization in the Solid State" in Pure and Applied Chemistry, 1971, 27, pp. 647-678.
Schneider "Mechanisms of Molecular Recognition : Investigations of Organic Host-Guest Complexes", vol. 30, Issue 11, Nov. 1991, pp. 1417-1436.
Schuette et al. "Metallosupramolecular Thin Polyelectrolyte Films", Angewandte, vol. 37, Issue 20 Nov. 2, 1998 pp. 2891-2893.
Sedghi et al. "Single molecule conductance of porphyrin wires with ultralow attenuation", J Am Chem Soc. Jul. 9, 2008;130(27):8582-3.
Sedghi et al. "Long-range electron tunnelling in oligo-porphyrin molecular wires", Nat Nanotechnol. Jul. 31, 2011;6(8):517-23.
Selzer et al. "Effect of molecule-metal electronic coupling on through-bond hole tunneling across metal-organic monolayer-semiconductor junctions", J Am Chem Soc. Mar. 27, 2002;124(12):2886-7.
Shekhah et al. "Controlling interpenetration in metal-organic frameworks by liquid-phase epitaxy", Nat Mater. Jun. 2009;8(6):481-4.
Shekhah et al. "Step-by-step route for the synthesis of metal-organic frameworks", J Am Chem Soc. Dec. 12, 2007;129(49):15118-9.
Shinbo et al. "Fabrication and electrochemical properties of layer-by-layer deposited films containing phthalocyanine dyes", Thin Solid Films vols. 438-439, Aug. 22, 2003, pp. 177-181.
Shirman et al. "Assembly of crystalline halogen-bonded materials by physical vapor deposition", J Am Chem Soc. Jul. 2, 2008;130(26):8162-3.
Simao et al. "A three-state surface-confined molecular switch with multiple channel outputs", J Am Chem Soc. Aug. 31, 2011;133(34):13256-9.
Sknepnek et al. "Nanoparticle ordering via functionalized block copolymers in solution", ACS Nano. Jun. 2008;2(6):1259-65.
Smalley et al. "The Kinetics of Electron Transfer Through Ferrocene-Terminated Alkanethiol Monolayers on Gold", J. Phys. Chem., 1995, 99 (35), pp. 13141-13149.
Smalley et al. "Heterogeneous electron-transfer kinetics for ruthenium and ferrocene redox moieties through alkanethiol monolayers on gold", J Am Chem Soc. Feb. 19, 2003;125(7):2004-13.
Smith et al. "PH dependence of the electrochemical behavior of surfaces modified with a polymer derived from a monomer consisting of two viologen subunits linked by a quinone: evidence for rectification by synthetic molecular materials", J. Am. Chem. Soc., 1986, 108 (12), pp. 3522-3525.
Sortino et al. "Novel self-assembled monolayers of dipolar ruthenium(III/II) pentaammine(4,4'-bipyridinium) complexes on ultrathin platinum films as redox molecular switches", J Am Chem Soc. Feb. 5, 2003;125(5):1122-3.
Stalnaker et al. "Electron-transfer between iron, ruthenium, and osmium complexes containing 2,2'-bipyridyl, 1,10-phenanthroline, or their derivatives. Effects of electrolytes on rates", J. Phys. Chem., 1977, 81 (7), pp. 601-604.
Terada et al. "Memory effects in molecular films of free-standing rod-shaped ruthenium complexes on an electrode", Angew Chem Int Ed Engl. Jul. 4, 2011;50(28):6287-91.
Terada et al. "Long-range electron transport of ruthenium-centered multilayer films via a stepping-stone mechanism", ACS Nano. Mar. 27, 2012;6(3):1988-99.
Thompson et al. "Hydrolysis and Condensation of Self-Assembled Monolayers of (3-Mercaptopropyl)trimethoxysilane on Ag and Au Surfaces", Langmuir, 1997, 13 (8), pp. 2291-2302.
Tuccitto et al. "Highly conductive approximately 40-nm-long molecular wires assembled by stepwise incorporation of metal centres", Nat Mater. Jan. 2009;8(1):41-6.
Ulman "Formation and Structure of Self-Assembled Monolayers", Chem Rev. Jun. 20, 1996;96(4):1533-1554.
Van Der Boom et al. "Single Reactor Route to Polar Superlattices. Layer-by-Layer Self-Assembly of Large-Response Molecular Electrooptic Materials by Protection-Deprotection", Chem. Mater., 2001, 13 (1), pp. 15-17.
Van Der Boom et al. "Nanoscale Consecutive Self-Assembly of Thin-Film Molecular Materials for Electrooptic Switching. Chemical Streamlining and Ultrahigh Response Chromophores", Langmuir, 2002, 18 (9), pp. 3704-3707.
Vermonden et al. "3-D Water-Soluble Reversible Neodymium(III) and Lanthanum(III) Coordination Polymers", European Journal of Inorganic Chemistry vol. 2004, Issue 14, pp. 2847-2852, Jul. 2004.
Walsh et al. "Modulation of Heterogeneous Electron-Transfer Dynamics Across the Electrode/Monolayer Interface", J. Phys. Chem. B, 2004, 108 (8), pp. 2631-2636.
Wanunu et al. "Branched coordination multilayers on gold", J Am Chem Soc. Dec. 21, 2005;127(50):17877-87.
Welter et al. "Electroluminescent device with reversible switching between red and green emission", Nature. Jan. 2, 2003;421(6918):54-7.
Whitesides et al. "Soft Lithographys", Angew. Chem. Int. Ed., 1998, 37, 550.
Willner, I, Katz, E., Bioelectronics: From Theory to Applications; VCH—Wiley: Weinheim, 2005.
Wittkopp et al. "Cis-regulatory elements: molecular mechanisms and evolutionary processes underlying divergence", Nat Rev Genet. Dec. 6, 2011;13(1):59-69.
Wu et al. "Engineering of osmium(II)-based light absorbers for dye-sensitized solar cells", Angew Chem Int Ed Engl. Jun. 4, 2012;51(23):5642-6.
Yang et al. "Photodimerization of P2VB on Au(111) in Solution Studied with Scanning Tunneling Microscopy", J. Phys. Chem. B, 2003, 107 (22), pp. 5116-5119.
Yasutomi et al. "A molecular photodiode system that can switch photocurrent direction", Science. Jun. 25, 2004;304(5679):1944-7.
Yerushalmi et al. "Enhancement of molecular properties in thin films by controlled orientation of molecular building blocks", J Am Chem Soc. Mar. 10, 2004;126(9):2700-1.
Yerushalmi et al. "Stimuli responsive materials: new avenues toward smart organic devices", J. Mater. Chem., 2005, 15, 4480-4487.
Yin et al. "Structure optimization of ruthenium photosensitizers for efficient dye-sensitized solar cells—A goal toward a "bright" future", Coordination Chemistry Reviews 256 (2012) 3008-3035.
Yitzhaik et al. "Chromophoric Self-Assembled Superlattices", Acc. Chem. Res., 1996, 29 (4), pp. 197-202.
Yonemoto et al. "Electron-Transfer Reactions of Ruthenium Trisbipyridyl-Viologen Donor-Acceptor Molecules: Comparison of the Distance Dependence of Electron Transfer-Rates in the Normal and Marcus Inverted Regions", J. Am. Chem. Soc., 1994, 116 (11), pp. 4786-4795.
Yoon et al. "Sigma-pi molecular dielectric multilayers for low-voltage organic thin-film transistors", Proc Natl Acad Sci U S A. Mar. 29, 2005;102(13):4678-82.
Yu et al. "Ruthenium porphyrin functionalized single-walled carbon nanotube arrays—a step toward light harvesting antenna and multibit information storage", J Am Chem Soc. Jul. 9, 2008;130(27):8788-96.
Zacher et al. "Surface chemistry of metal-organic frameworks at the liquid-solid interface", Angew Chem Int Ed Engl. Jan. 3, 2011;50(1):176-99.
Zeira et al. "Patterned organosilane monolayers as lyophobic-lyophilic guiding templates in surface self-assembly: monolayer self-assembly versus wetting-driven self-assembly", Langmuir. Dec. 15, 2009;25(24)13984-4001.

(56) References Cited

OTHER PUBLICATIONS

Zhao et al. "Organic Diodes Based on Redox-Polymer Bilayer-Film-Modified Electrodes", Helvetica Chimica Acta vol. 77, Issue 1, pp. 351-371, Feb. 9, 1994.

Zhao et al. "Fabrication and optoelectronic properties of novel films based on functionalized multiwalled carbon nanotubes and (phthalocyaninato)ruthenium(II) via coordination bonded layer-by-layer self-assembly", Langmuir. Oct. 19, 2010;26(20):16084-9.

Zhao et al. "Pathogenicity and Immunogenicity of a Vaccine Strain of Listeria monocytogenes That Relies on a Suicide Plasmid to Supply an Essential Gene Product", Infection and Immunity, Sep. 2005, p. 5789-5798, vol. 73, No. 9.

Zheng et al. "A facile approach toward multicomponent supramolecular structures: selective self-assembly via charge separation", J Am Chem Soc. Dec. 1, 2010;132(47):16873-82.

Zhu et al. "Vapor phase self-assembly of electrooptic thin films via triple hydrogen bonds", J Am Chem Soc. Sep. 24, 2003;125(38):11496-7.

De Ruiter et al. "Composite molecular assemblies: Nanoscale structural control and spectroelectrochemical diversity" Journal of the American Chemical Society. Oct. 25, 2013;135(44):16533-44.

\* cited by examiner

M2

LOGIC CIRCUITS WITH PLUG AND PLAY SOLID-STATE MOLECULAR CHIPS

FIELD OF THE INVENTION

The present invention relates to logic circuits in general, and in particular to logic circuits with solid-state molecular chips.

BACKGROUND OF THE INVENTION

The development of the transfer resistor (transistor) has played a major role in the development of modern-day electronics and computer systems. The global cooperative behavior of transistors in electronic circuits can be analyzed systematically in terms of Boolean algebra. However, the realization that interaction in a system capable of being in two states could be analyzed in terms of Boolean algebra, is quite important, since this led to the development of the field of Molecular Logic. Molecular substrates can be viewed as computational devices that process physical or chemical 'inputs' to generate 'outputs' based on a set of logical operators. In the ever-continuing race of computing electronics industry to produce smaller components that consume less energy, the small size of molecular logic systems is a distinct advantage over conventional semiconductor counterparts. Most of the initial developments in molecular systems were done in solutions, an environment that is less friendly for commercial and mass-market devices. There is thus a great need in the industry to develop molecular systems that are based on solid state components.

SUMMARY OF THE INVENTION

In one aspect, the present invention relates to a logic circuit for performing a logic operation such that predetermined inputs to the logic circuit produce a logical output according to said logic operation, comprising:

a plurality of predetermined solid-state molecular chips, each molecular chip comprising a layer of an active compound confined to a solid support, each molecular chip having multiple states, each state being obtained after application of a corresponding input, each state being read electrically, optically, electro-chemically or any combination thereof;

a plurality of predetermined inputs, such that after applying said predetermined inputs on said predetermined molecular chips, reading the states of said plurality of molecular chips produces a logical output according to said logic operation.

In some embodiments, the molecular chip further comprises one or more layers of one or more active compounds coupled to the layer of an active compound.

In some embodiments, the states of the plurality of the molecular chips are read optically, magnetically, electrically, or electrochemically, based on changes in conductivity, magnetism, current, absorption, refractive index readout, Infra-Red (IR) readout or Near IR (NIR) readout.

In some embodiments, the input comprises application of an electric current, application of an electric/magnetic field, immersion in a solution, or any combination thereof.

In particular such embodiments, the solution is an acidic solution of organic or mineral acid or oxoacid; a basic solution of organic or inorganic base; a solution comprising an oxidizing or reducing agent; or a solution comprising a metal ion, an anion, an organic cation, or a gas.

In more particular such embodiments: (i) the organic acid is acetic acid, propionic acid, butyric acid, formic acid, oxalic acid, glycolic acid, citric acid, succinic acid, ascorbic acid, lactic acid, salicylic acid, pivalic acid, diethylacetic acid, malonic acid, benzoic acid, phenylpropionic acid, pimelic acid, fumaric acid, maleic acid, malic acid, gluconic acid, isonicotinic acid, sulfaminic acid, adipic acid, paratoluenesulfonic acid, naphthalenedisulfonic acid, uric acid, oxalic acid, sulfonic acid, tartaric acid, or a mixture thereof; (ii) the mineral acid or oxoacid is HCl, HBr, HI, $HNO_3$, $H_2SO_4$, $H_3PO_4$, $HClO_4$, $HBrO_4$, $HIO_4$, $HBF_4$, $H_3BO_3$, $HPF_6$; a derivative of aforesaid such as $HNO_2$, $H_3PO_2$, $H_2SO_3$, $H_2SO_2$, $HClO_3$, $HClO_2$, $HClO$, $HBrO_3$, $HBrO_2$, $HBrO$, $HIO_3$, $HIO_2$, $HIO$, and $HBO_2$; or an acid solution of $PCl_5$ or $PO_5$; (iii) the organic base is a pyridine, imidazole, benzimidazole, amine, or hystidine; (iv) the inorganic base is an alkali hydroxide such as LiOH, NaOH, KOH, or CsOH; a metal hydroxide such as aluminium hydroxide, beryllium hydroxide, cobalt(II) hydroxide, copper(II) hydroxide, gold(III) hydroxide, iron(II) hydroxide, mercury (II) hydroxide, nickel(II) hydroxide, tin(II) hydroxide, zinc hydroxide, or zirconium(IV) hydroxide; a metal oxide/hydroxide such as FeOOH; a carbonate such as lithium carbonate, sodium carbonate, or potassium carbonate; a bicarbonate such as lithium bicarbonate, sodium bicarbonate, or potassium bicarbonate; ammonia; or a metal amide such as lithium amide, sodium amide, or potassium amide; (v) the oxidizing agent is $K_2CrO_4$, $KMnO_4$, $NaMnO_4$, $OsO_4$, $NOBF_4$, $FeCl_3$, $H_2SO_5$, $H_2SO_8$, $N_2O$, $HNO_3$, $Ag_2O$, oxygen, ozone, $H_2O_2$, sodium perborate, $F_2$, $Br_2$, $Cl_2$, $I_2$, $ClO_2^-$, $ClO_3^-$, or $HClO_4$; (vi) the reducing agent is sodium sulfide, dithiothreitol, lithium aluminium hydride, sodium borohydride, sodium amalgam (Na(Hg)), zinc-mercury amalgam (Zn(Hg)), diisobutylaluminum hydride (DIBAH), $Sn^{2+}$, or $Fe^{2+}$; (vii) the metal ion is an ion of Li, Na, K, Rb, Cs, Fr, Mg, Ca, Sr, Ba, Ra, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg, Al, Ga, In, Tl, Ge, Sn, Pb, As, Sb, Bi, Se, or Te; (viii) the anion is cyanide, carbonate, nitrate, nitrite, phosphate, phosphite, sulfide, sulfphate, sulphite, chloride, bromide, iodide, fluoride, or a derivative thereof; (ix) the organic cation is a quaternary ammonium compound of the formula $N(R')_4^+$, wherein R' each independently is H, or $(C_1-C_{10})$alkyl; or (x) the gas is CO, $CO_2NO$, $Cl_2$, $Br_2$, He, Ne, or Ar.

In some embodiments each of the plurality of molecular chips comprises one or more layers of one or more active compounds coupled to said layer of an active compound, and the active compound each independently comprises an organic, metal-organic, inorganic, polymeric, or coordination compound or metal-organic framework/network/polymer.

In certain particular such embodiments, the metal-organic compound is a polypyridyl complex of the general formula I:

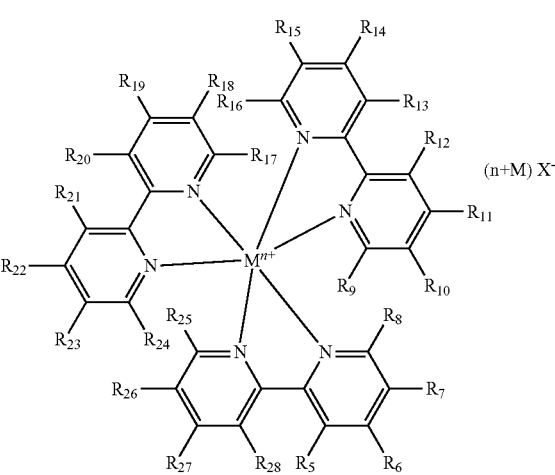

I wherein M is Os, Fe, Ru, Mn, Cu, Zn, Ni, Cr, Ti, V, Ir, or Rh;

n is the formal oxidation state of M, wherein n is 0 to 4; m is the positive charge of the tris-bipyridyl ligand, wherein m is an integer from 0 to 24, X is a counter anion selected from $Br^-$, $Cl^-$, $F^-$, $I^-$, $PF_6^-$, $BF_4^-$, $OH^-$, $ClO_4^-$, $SO_3^-$, $CF_3COO^-$, $CN^-$, $alkylCOO^-$, $arylCOO^-$ or a combination thereof; and $R_5$ to $R_{28}$ is each independently selected from hydrogen, halogen, hydroxyl, azido, nitro, cyano, amino, substituted amino, thiol, $C_1$-$C_{10}$ alkyl, cycloalkyl, heterocycloalkyl, haloalkyl, aryl, heteroaryl, alkoxy, alkenyl, alkynyl, carboxamido, substituted carboxamido, carboxyl, protected carboxyl, protected amino, sulfonyl, substituted aryl, substituted cycloalkyl or substituted heterocycloalkyl, wherein at least one of the $R_5$ to $R_{28}$ is a group A linked to the ring structure of the compound of general formula I via $R_4$, or B linked to the ring structure of the compound of general formula I via the oxygen:

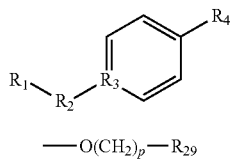

A

—O(CH$_2$)$_p$—R$_{29}$   B wherein $R_4$ is selected from cis/trans C=C, C≡C, N=N, C=N, N=C, C—N, N—C, alkylene, arylene or a combination thereof; $R_3$ is C or N; $R_2$ is absent or is selected from hydrogen, alkyl, alkylene, aryl, arylene, OH, O-alkyl, O-alkylene or a combination thereof; and $R_1$ is absent or is selected from hydrogen, trialkoxysilane, trihalidesilane, thiol, COOH, COO—, $Si(OH)_3$, $Si(OEt)_3$, $Si(OMe)(Me)_2$, $SiCl_3$, $SiMe_2Cl$, zirconate, sulfate, or phosphonate; and p is an integer from 9 to 12; and $R_{29}$ is selected from hydrogen, trialkoxysilane, trihalidesilane, thiol, COOH, COO—, $Si(OH)_3$, $Si(OEt)_3$, $Si(OMe)(Me)_2$, $SiCl_3$, $SiMe_2Cl$, zirconate, sulfate, or phosphonate; and any two vicinal $R_5$-$R_{28}$ substituents, together with the carbon atoms to which they are attached, may form a fused ring system selected from cycloalkyl, heterocycloalkyl, heteroaryl or aryl, wherein the fused system may be substituted by one or more groups selected from $C_1$-$C_{10}$ alkyl, aryl, azido, cycloalkyl, halogen, heterocycloalkyl, alkoxy, hydroxyl, haloalkyl, heteroaryl, alkenyl, alkynyl, nitro, cyano, amino, substituted amino, carboxamido, substituted carboxamido, carboxyl, protected carboxyl, protected amino, thiol, sulfonyl or substituted aryl; and the fused ring system may also contain at least one heteroatom selected from N, O or S.

Specific such embodiments are those in which the polypyridyl complex is the compound of the general formula I, wherein M is Os, n is 2, m is 1, X is $Br^-$, $Cl^-$, $F^-$, $I^-$, $PF_6^-$, $BF_4^-$, $OH^-$, $ClO_4^-$, $SO_3^-$, $CF_3COO^-$, $CN^-$, $alkylCOO^-$, $arylCOO^-$ or a combination thereof, $R_5$, $R_7$ to $R_{26}$ and $R_{28}$ each is hydrogen, $R_6$ is methyl, and $R_{27}$ is A, wherein $R_4$ is C=C, $R_3$ is N, $R_2$ is propyl, and $R_1$ is $Si(OMe)_3$, $Si(OEt)_3$, $Si(OMe)(Me)_2$, $SiCl_3$, or $SiMe_2Cl$. In some particular embodiments, the polypyridyl complex is the compound of the general formula I, wherein M is Os, n is 2, m is 1, X is $PF_6^-$ or $I^-$, $R_5$, $R_7$ to $R_{26}$ and $R_{28}$ each is hydrogen, $R_6$ is methyl, and $R_{27}$ is A, wherein $R_4$ is C=C, $R_3$ is N, $R_2$ is propyl, and $R_1$ is $Si(OMe)_3$, herein identified compounds 1a and 1b, respectively.

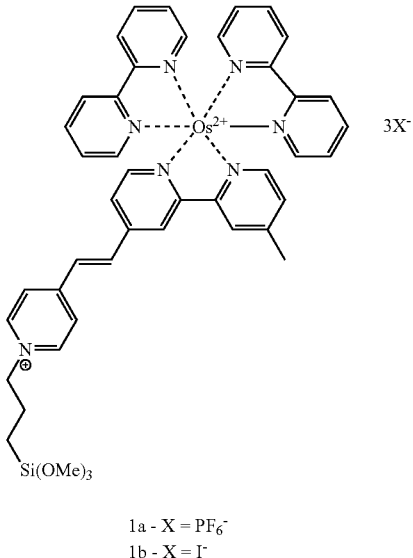

1a - X = $PF_6^-$
1b - X = $I^-$

In other certain particular such embodiments, the metal-organic compound is $[M_1^{II}(2,2'\text{-bipyridine})_3]^{2+}$ or $[M_1^{II}(2,2'\text{-bipyridine})_2(4\text{-methyl-2,2'-bipyridine-pyridine})]^{2+}$, wherein $M_1$ is Os, Fe, Ru, Mn, Cu, Co, Zn, Ni, Cr, Ti, V, Ir, or Rh.

In further particular such embodiments, the organic compound is selected from (i) viologen (4,4'-bipyridylium salts); (ii) azole compounds; (iii) azo compounds including azobenzenes; (iv) aromatic amines; (v) carbazoles; (v) cyanines; (vi) methoxybiphenyls; (vii) quinones; (viii) thiazines; (ix) pyrazolines; (x) tetracyanoquinodimethanes (TCNQs); (xi) tetrathiafulvalene (TTF); (xii) porphyrins; (xiii) corroles; (xiv) phthalocyanines; (xv) diarylethenes including stilbenes; (xvi) dithienylethenes, (xvii) fulgides; (xviii) spiropyrans; (xix) phenoxynaphtacene quinines; or (xx) derivatives of compounds defined in (i)-(xix).

In more particular such embodiments, the porphyrin used as an active compound in the logic circuit of the present invention is an unmetallated porphyrin of the general formula II, or a metallated porphyrin of the general formula III:

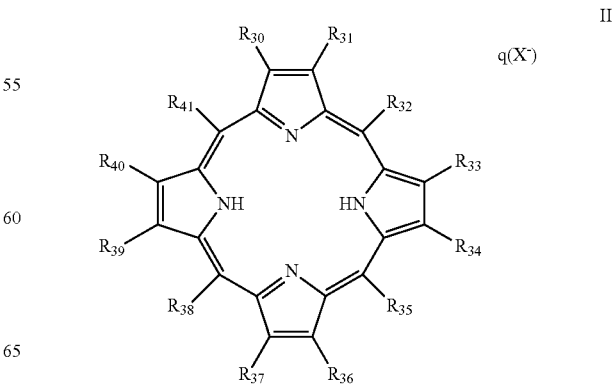

II q(X$^-$)

-continued

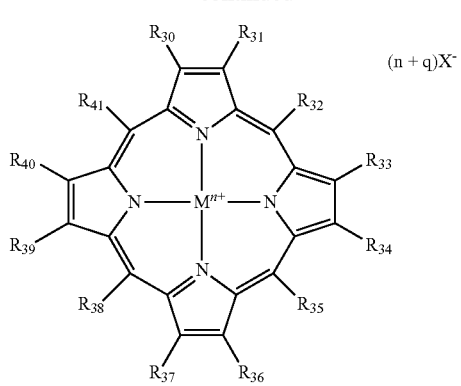

wherein

M is Os, Fe, Ru, Mn, Cu, Zn, Ni, Cr, Ti, V, Ir, or Rh;

n is the formal oxidation state of M, wherein n is 0 to 4;

q is the overall positive charge of the $R_{30}$ to $R_{41}$ groups, wherein q is an integer from 0 to 12;

X is a counter anion selected from $Br^-$, $Cl^-$, $F^-$, $I^-$, $PF_6^-$, $BF_4^-$, $OH^-$, $ClO_4^-$, $SO_3^-$, $CF_3COO^-$, $CN^-$, $alkylCOO^-$, $arylCOO^-$, or a combination thereof; and $R_{30}$ to $R_{41}$ each independently is selected from hydrogen, halogen, hydroxyl, azido, nitro, cyano, amino, substituted amino, thiol, $C_1$-$C_{10}$ alkyl, cycloalkyl, heterocycloalkyl, haloalkyl, aryl, heteroaryl, alkoxy, alkenyl, alkynyl, carboxamido, substituted carboxamido, carboxyl, protected carboxyl, protected amino, sulfonyl, substituted aryl, substituted cycloalkyl or substituted heterocycloalkyl, wherein at least one of the $R_{30}$ to $R_{41}$ is a group A linked to the porphyrin of general formula II or III via $R_4$, or B linked to the porphyrin of general formula II or III via the oxygen:

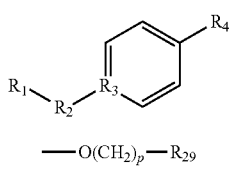

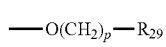

wherein $R_4$ is absent or selected from cis/trans C=C, C≡C, N=N, C=N, N=C, C—N, N—C, alkylene, arylene or a combination thereof; $R_3$ is C or N; $R_2$ is absent or is selected from hydrogen, alkyl, alkylene, aryl, arylene, OH, O-alkyl, O-alkylene or a combination thereof; and $R_1$ is absent or is selected from hydrogen, trialkoxysilane, trihalidesilane, thiol, COOH, COO—, $Si(OH)_3$, $Si(OEt)_3$, $Si(OMe)(Me)_2$, $SiCl_3$, $SiMe_2Cl$, zirconate, sulfate, or phosphonate; and p is an integer from 9 to 12; and $R_{29}$ is selected from hydrogen, trialkoxysilane, trihalidesilane, thiol, COOH, COO—, $Si(OH)_3$, zirconate, sulfate, or phosphonate; and any two vicinal $R_{30}$-$R_{41}$ substituents, together with the carbon atoms to which they are attached, may form a fused ring system selected from cycloalkyl, heterocycloalkyl, heteroaryl or aryl, wherein the fused system may be substituted by one or more groups selected from $C_1$-$C_{10}$ alkyl, aryl, azido, cycloalkyl, halogen, heterocycloalkyl, alkoxy, hydroxyl, haloalkyl, heteroaryl, alkenyl, alkynyl, nitro, cyano, amino, substituted amino, carboxamido, substituted carboxamido, carboxyl, protected carboxyl, protected amino, thiol, sulfonyl or substituted aryl; and the fused ring system may also contain at least one heteroatom selected from N, O or S.

According to the present invention, the unmetallated porphyrin of the general formula II may be either neutral, i.e., when q is 0, and $R_3$ is C, or positively charged due to one or more, i.e., 1, 2, 3, 4, 5, or more, positively charged groups A, i.e., groups A in which $R_3$ is N, representing one or more of $R_3$ to $R_{41}$. Similarly, the metallated porphyrin of the general formula III may be either neutral, i.e., when both n and q are 0, and $R_3$ is C, or positively charged due to the positive charge of the metal (n is 1, 2, 3 or 4) and/or one or more, i.e., 1, 2, 3, 4, 5, or more, positively charged groups A, i.e., groups A in which $R_3$ is N, representing one or more of $R_3$ to $R_{41}$.

Specific such embodiments are those where the porphyrin is the compound of the general formula II, wherein $R_{30}$, $R_{31}$, $R_{33}$, $R_{34}$, $R_{36}$, $R_{37}$, $R_{39}$ and $R_{40}$ each is H; $R_{32}$, $R_{38}$ and $R_{41}$ each is 4-pyridyl; and $R_{35}$ is A, wherein $R_4$ is absent, $R_3$ is N, $R_2$ is —$CH_2$-phenyl and $R_1$ is —$Si(Cl)_3$, herein identified compound 2:

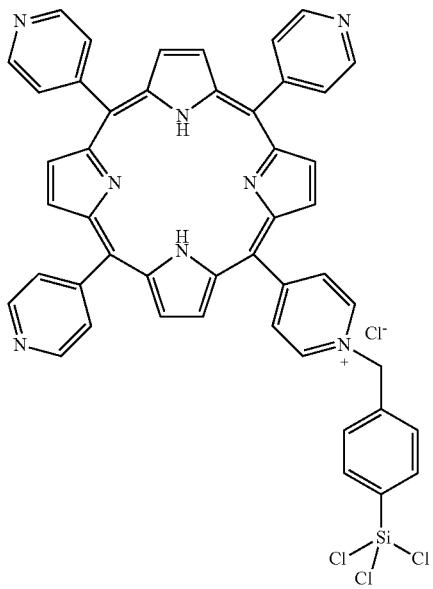

In yet other certain particular such embodiments, the inorganic compound comprises tungsten oxide, iridium oxide, vanadium oxide, nickel oxide, molybdenum oxide, titanium oxide, manganese oxide, niobium oxide, copper oxide, tantalum oxide, rhenium oxide, rhodium oxide, ruthenium oxide, iron oxide, chromium oxide, cobalt oxide, cerium oxide, bismuth oxide, tin oxide, praseodymium, bismuth, lead, silver, lanthanide hydrides ($LaH_2$/$LaH_3$), nickel doped $SrTiO_3$, indium nitride, ruthenium dithiolene, phosphotungstic acid, ferrocene-naphthalimides dyads, organic ruthenium complexes, or any mixture thereof.

In still further certain particular such embodiments, the polymeric compound comprises a conducting polymer such as a polypyrrole, polydioxypyrrole, polythiophene, polyaniline, poly(acetylene), poly(p-phenylene sulfide), poly(p-phenylene vinylene) (PPV), polyindole, polypyrene, polycarbazole, polyazulene, polyazepine, poly(fluorene), polynaphthalene, polyfuran, a metallopolymeric film based on a polypyridyl complex or polymeric viologen system comprising pyrrole-substituted viologen pyrrole, disubstituted viologen, N,N'-bis(3-pyrrol-1-ylpropyl)-4,4'-bipyridylium or a derivative of the conducting polymer.

In some embodiments, the solid support of the logic circuit of the present invention, in any one of the configurations defined above, is a material selected from glass, a doped glass, indium tin oxide (ITO)-coated glass, silicon, a doped silicon, Si(100), Si(111), $SiO_2$, SiH, silicon carbide minor, quartz, a metal, metal oxide, a mixture of metal and metal oxide, group IV elements, mica, a graphite comprising intercalated metal cations, a polymer such as polyacrylamide and polystyrene, a plastic, a zeolite, a clay, a membrane, an optical fiber, a ceramic, a metalized ceramic, an alumina, an electrically-conductive material, a semiconductor, steel, or a stainless steel.

In some embodiments, the plurality of molecular chips ($n_1$) in the logic circuit of the present invention, in any one of the configurations defined above, are applied a plurality of inputs ($n_2$), producing one or more output information streams ($n_3$) representing the predetermined logical output of said logic circuit, such that $n_1 < n_2$ and $n_3 \leq n_1$.

For each logic operation to be performed, a predetermined set of appropriate molecular chips is selected. A particular molecular chip can be applied (used) in more than one logic operation. A molecular chip can be fit to use with certain logical operations but may not be fit to use with other logic operations. For each logic operation, the selected plurality of molecular chips are all applied a plurality of predetermined inputs. Each logic operation is defined by its own set of molecular chips that can be used and by corresponding predetermined inputs to be applied on those molecular chips. An input may or may not affect a molecular chip by changing its state. Certain inputs may not cause any change in the state of a molecular chip, while other inputs will result in the molecular chip changing its electrical, electrochemical, magnetical, and/or optical states. A change of state may also be any combination of the electrical, electrochemical, magnetical or optical characteristic of the molecular chip. After the molecular chips have been applied an input, their resulting state (which can either remain the initial state or can be changed by the input to a new state) is an output representing a piece of information. The resulting state of the plurality of molecular chips, i.e. the output information streams ($n_3$), represent the logical output of the logic circuit.

In some embodiments, the plurality of molecular chips perform one or more of the following logic operations: AND, OR, NOT, XOR, NAND, NOR, XNOR, or any combination thereof.

In some embodiments, the plurality of molecular chips operate using Boolean Logic, Sequential Logic, a combination of Boolean Logic and Sequential Logic.

In some embodiments, the plurality of molecular chips operate as a sensor, a detector, an encoder, a decoder, a set/reset latch, a memory element or a multistate memory element.

In some embodiments, the plurality of molecular chips operate using base 2, base 3, base 4, base 5, base 6, base 7, base 8, base 9, base 10, base 16 or a combination thereof.

In some embodiments, the plurality of molecular chips operate using light.

In some embodiments, the plurality of molecular chips operate using organic electronics, molecular electronics or a combination thereof.

In another aspect, the present invention relates to a logic circuit performing a logic operation, for the detection of inputs to the logic circuit, comprising:

a plurality of predetermined solid-state molecular chips, each molecular chip comprising a layer of an active compound confined to a solid support, each molecular chip having multiple states, each state being obtained after application of a corresponding input, each state being read electrically, optically, electro-chemically or any combination thereof;

a logical output obtained by reading the states of said plurality of molecular chips after application of said inputs, such that knowing the logical output which can only be obtained after application of predetermined inputs on said plurality of molecular chips produces the detection of said inputs.

In some embodiments, the inputs comprise an electric current, an electric/magnetic field, a solution, or any combination thereof.

It should be noted that the solution comprised within the logic circuit for the detection of inputs according to the present invention is as defined above with respect to the logic circuit for performing a logic operation of the present invention.

It should be further noted that the active compound comprised within each molecular chip in the logic circuit for the detection of inputs according to the present invention is as defined above with respect to the logic circuit for performing a logic operation of the present invention.

The logic circuit for the detection of inputs can thus perform in a single operation, the detection of multiple conditions or states such as reading pH levels and analyzing presence of heavy metals (chromium etc.).

Thus the logic circuit for the detection of inputs of the invention can use the results of the multiple detection capabilities (of chemical, electrical or light conditions or states) either to perform logic operations or to report multiple detection results.

In yet another aspect the present invention relates to a method for performing a logic operation in a logic circuit such that predetermined inputs to the logic circuit produce a logical output according to said logic operation, the method comprising the steps of:

selecting a plurality of predetermined solid-state molecular chips, each molecular chip comprising a layer of an active compound confined to a solid support, each molecular chip having multiple states, each state being obtained after application of a corresponding input, each state being read electrically, optically, electro-chemically or any combination thereof;

applying a plurality of predetermined inputs, such that after applying said predetermined inputs on said predetermined molecular chips, reading the states of said plurality of molecular chips produces a logical output according to said logic operation.

In yet another aspect the present invention relates to a method for the detection of inputs to a logic circuit performing a logic operation, the method comprising the steps of:

selecting a plurality of predetermined solid-state molecular chips, each molecular chip comprising a layer of an active compound confined to a solid support, each molecular chip having multiple states, each state being obtained after application of a corresponding input, each state being read electrically, optically, electro-chemically or any combination thereof;

reading the states of said plurality of molecular chips after application of said inputs; and calculating a logical output based on the states of said plurality of molecular chips, such that knowing the logical output which can only be obtained after application of predetermined inputs on said plurality of molecular chips produces the detection of said inputs.

It should be noted that all the input characteristics and active compound definitions of the method for performing a logic operation in a logic circuit and of the method for the detection of inputs to a logic circuit according to the present invention, are defined above with respect to the logic circuit for performing a logic operation of the present invention.

BRIEF DESCRIPTION OF THE DRAWINGS

FIG. 1A shows a monolayer of $Os(bpy)_2(mbpy-py)][PF_6]_2$ (M1) covalently attached to a quartz surface through iodopropyltrimethoxysilane; and FIG. 1B shows a monolayer of 5,10,15,20-tetra(4-pyridyl)porphyrin (M2) covalently attached to quartz surface through 4-(chloromethyl)-phenyltrichlorosilane.

DETAILED DESCRIPTION OF THE INVENTION

Figure 1A:
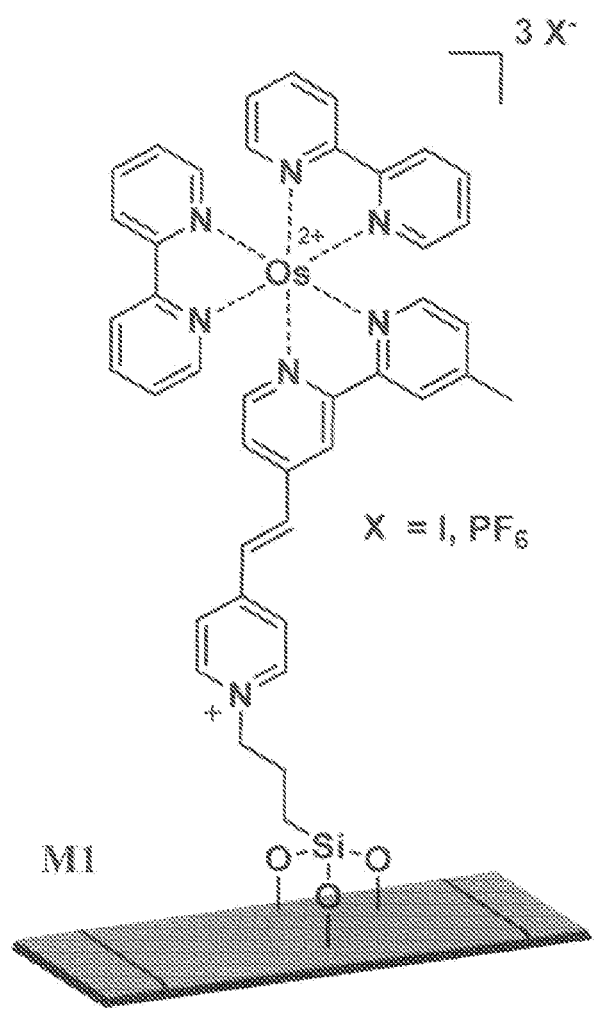
FIGS. 1A-1B show representative molecular structures of the molecular chips M1 (FIG. 1A) and M2 (FIG. 1B).

The present invention relates to a logic circuit for performing a logic operation. For each logic operation it is defined a set of predetermined multiple solid-state molecular chips. The molecular chips used are characterized by having multiple, stable states. The state of the molecular chips is read electrically, optically, electro-chemically or any combination thereof. The state of a molecular chip can be changed by applying an appropriate input. Each specific state of a molecular chip is obtained by applying a corresponding input. Each molecular chip can be sensitive to (affected by) one or more inputs that can change its state, as can be observed in Examples 1, 2 and 3 below. Also, the molecular chip may be insensitive to (neutral) one or more inputs that will never change its state.

In order to perform a given logical operation, a plurality of predetermined inputs is applied to a plurality of the predetermined molecular chips (as defined for the logical operation). Before applying the inputs, each of the molecular chips can be in any of its multiple states. After the inputs are applied, the state of the molecular chips is read electrically, optically, electro-chemically (or any combination of modes) in order to produce the logical output. The state of the multiple chips is thus interpreted (calculated) in view of the given logic operation to produce the logical output of the logic circuit.

The logic operation is defined by the selection of the solid-state molecular chips to be used and the inputs to be applied, thus producing a logical output in accordance with the logic operation.

The same molecular chips can be used for various logic operations by varying the inputs applied thus producing different logical outputs.

A detection of multiple states at the same operation can serve different purposes. In some embodiments, the logic circuit performs a predetermined logic operation such that a given input produces a predetermined output according to the specific logic circuit designed (a truth table is one way to express for a given logical operation what is the output for any input parameters). In some embodiments, the input and output of the logic circuit is determined by reading the initial state of the molecular chips (i.e. before inputs are applied) and their later state after inputs are applied. Each molecular chip is designed to be read in a particular electrical, optical, or electro-chemical way. It is possible to read the same molecular chip in multiple electrical ways and/or multiple optical ways and/or multiple electro-chemical ways. In the same logic circuit, each molecular chip can be read in a different way, for example, one molecular chip can be read electrically, while another molecular chip being read electro-chemically and other molecular chips are read optically. Each molecular chip can thus be read using a particular device or method. Alternatively, a particular device or method can be used for reading multiple different molecular chips. The molecular chips are both small in size and in a solid state so they can be reused conveniently. After a molecular chip is applied an input and its new state read, the molecular chip can be reinitialized back to its initial state (ground state) according to the nature of the molecular chip.

In a logic-circuit implementation the aim is to design a logic operation such that a given input will determine a given output, all in accordance with the rules of the logic operation (as can be defined in a truth table). Alternatively, in another aspect, the logic circuit of the invention can be looked at as an input detection mechanism (sensor). In these implementations the state of the input is unknown and reading the output of the logic circuit, i.e. the states of the molecular chips after being applied inputs, will reveal the nature of the input, for example, the pH levels, presence of heavy metals etc.

The logic circuit of the invention can be looked as containing three parameters: inputs, molecular chips and logical output. The relationship between these three parameters is known in advance: a predetermined input to predetermined molecular chips will yield a known logical output in accordance with the truth table of the logical operation. If we apply predetermined inputs to predetermined molecular chips the logic circuit provides us with the logical output as defined by the logic operation. When we know the logical output of the logic operation and the molecular chips known, the logic circuit functions as a detector (sensor) for detecting the inputs used.

The term "pyridyl complex", as used herein, refers to a metal having one or more pyridyl ligands, e.g., $OS^{2+}$, $Fe^{2+}$, $Ru^{2+}$, $Mn^{2+}$, $Cu^{2+}$, $Zn^{2+}$, $Ni^{2+}$, $Cr^{3+}$, $Ti^{2+}$, $V^{2+}$, $Ir^{3+}$, or $Rh^{3+}$ is coordinated to one or more pyridyl ligands. In certain embodiments, the active compound of the invention is a polypyridyl complex of the general formula I as defined above.

In some embodiments, the polypyridyl complex is the compound of the general formula I as defined above, wherein M is Os, n is 2, m is 1, X is $Br^-$, $Cl^-$, $F^-$, $I^-$, $PF_6^-$, $BF_4^-$, $OH^-$, $ClO_4^-$, $SO_3^-$, $CF_3COO^-$, $CN^-$, $alkylCOO^-$, $arylCOO^-$ or a combination thereof, $R_5$, $R_7$ to $R_{26}$ and $R_{28}$ each is hydrogen, $R_6$ is methyl, and $R_{27}$ is A, wherein $R_4$ is C≡C, $R_3$ is N, $R_2$ is propyl, and $R_1$ is $Si(OMe)_3$, $Si(OEt)_3$, $Si(OMe)(Me)_2$, $SiCl_3$, or $SiMe_2Cl$. In some particular embodiments the polypyridyl complex is compound 1a or compound 1b.

In some embodiments, the states of the molecular chips comprising the polypyridyl complex of the general formula 1 are read optically, electrically, electro-chemically or any combinations thereof.

In some embodiments, the metal-organic compound is $[M_1^{II}(2,2'\text{-bipyridine})_3]^{2+}$ or $[M_1^{II}(2,2'\text{-bipyridine})_2(4\text{-methyl-2,2'-bipyridine-pyridine})]^{2+}$, wherein $M_1$ is Os, Fe, Ru, Mn, Cu, Co, Zn, Ni, Cr, Ti, V, Ir, or Rh.

In some embodiments, the states of the molecular chips comprising the metal organic compounds are read optically, electrically, or electro-chemically.

In some embodiments, the organic compound is selected from (i) viologen (4,4'-bipyridylium salts); (ii) azole compounds; (iii) azo compounds including azobenzenes; (iv) aromatic amines; (v) carbazoles; (v) cyanines; (vi) methoxybiphenyls; (vii) quinones; (viii) thiazines; (ix) pyrazolines; (x) tetracyanoquinodimethanes (TCNQs); (xi) tetrathiafulvalene (TTF); (xii) porphyrins; (xiii) corroles; (xiv) phthalocyanines; (xv) diarylethenes including stilbenes; (xvi) dithienylethenes, (xvii) fulgides; (xviii) spiropyrans; (xix) phenoxynaphthacene quinines; or (xx) derivatives of compounds defined in (i)-(xix).

In some embodiments, the active compound of the invention is a porphyrin of the general formula II as defined above. Specific such embodiments are those wherein the porphyrin is the compound of the general formula II, wherein $R_{30}$, $R_{31}$, $R_{33}$, $R_{34}$, $R_{36}$, $R_{37}$, $R_{39}$ and $R_{40}$ each is H; $R_{32}$, $R_{38}$ and $R_{41}$ each is 4-pyridyl; $R_{35}$ is A, wherein $R_4$ is absent, $R_3$ is N, $R_2$ is —$CH_2$-phenyl and $R_1$ is —$Si(Cl)_3$, compound 2.

In certain embodiments, the metallated porphyrins are porphyrins of the general formula III as defined above.

In some embodiments, the states of the molecular chips comprising the organic compound are read optically.

In some embodiments, the states of the molecular chips comprising the inorganic compound are read optically and/or electrically.

The term "alkyl", as used herein, typically means a straight or branched hydrocarbon radical having preferably 1-10 carbon atoms, and includes, e.g., methyl, ethyl, n-propyl, isopropyl, n-butyl, isobutyl, sec-butyl, tert-butyl, n-pentyl, isopentyl, 2,2-dimethylpropyl, n-hexyl, n-heptyl, n-octyl, n-nonyl, n-decyl and the like. The alkyl may further be substituted. The term "alkylene" refers to a linear divalent hydrocarbon chain having preferably 1-10 carbon atoms and includes, e.g., methylene, ethylene, propylene, butylene, pentylene, hexylene, octylene and the like.

The term "alkenyl" typically means a straight or branched hydrocarbon radical having preferably 2-10 carbon atoms and one or more double bonds. Non-limiting examples of such alkenyls are ethenyl, 3-buten-1-yl, 2-ethenylbutyl, 3-octen-1-yl, and the like. The term "alkenylene" refers to a linear divalent hydrocarbon chain having preferably 2-10 carbon atoms and one or more double bonds, and includes, e.g., 1-propylene, 1-butylene, 2-butylene, 3-hexylene and the like.

The term "alkynyl" refers to a straight or branched hydrocarbon radical having preferably 2-10 carbon atoms and containing at least one triple bond.

The term "cycloalkyl" typically means a saturated aliphatic hydrocarbon in a cyclic form (ring) having preferably 3-10 carbon atoms. Non-limiting examples of such cycloalkyl ring systems include cyclopropyl, cyclobutyl, cyclopentyl, cyclohexyl, cyclodecyl and the like. The cycloalkyl may be fused to other cycloalkyls, such in the case of cis/trans decalin. The term "heterocycloalkyl" refers to a cycloalkyl, in which at least one of the carbon atoms of the ring is replaced by a heteroatom selected from N, O or S.

The term "alkylCOO" refers to an alkyl group substituted by a carboxyl group (—COO—) on any one of its carbon atoms. Preferably, the alkyl has 1-10 carbon atoms, more preferably $CH_3COO^-$.

The term "aryl" typically means any aromatic group, preferably having 6-14 carbon atoms such as phenyl and naphtyl. The aryl group may be substituted by any known substituents. The term "arylCOO" refers to such a substituted aryl, in this case being substituted by a carboxylate group.

The term "heteroaryl" refers to an aromatic ring system in which at least one of the carbon atoms is replaced by a heteroatom selected from N, O or S. Non-limiting examples of heteroaryl include pyrrolyl, furyl, thienyl, pyrazolyl, imidazolyl, oxazolyl, isoxazolyl thiazolyl, isothiazolyl, pyridyl, 1,3-benzodioxinyl, pyrazinyl, pyrimidinyl, 1,3,4-triazinyl, 1,2,3-triazinyl, 1,3,5-triazinyl, thiazinyl, quinolinyl, isoquinolinyl, benzofuryl, isobenzofuryl, indolyl, imidazo[1,2-a]pyridyl, pyrido[1,2-a]pyrimidinyl, benzimidazolyl, benzthiazolyl and benzoxazolyl.

The term "halogen" includes fluoro, chloro, bromo, and iodo. The term "haloalkyl" refers to an alkyl substituted by at least one halogen.

The term "alkoxy" refers to the group —OR, wherein R is an alkyl group. The term "azido" refers to —$N_3$. The term "nitro" refers to —$NO_2$ and the term "cyano" refers to —CN. The term "amino" refers to the group —$NH_2$ or to substituted amino including secondary, tertiary and quaternary substitutions wherein the substituents are alkyl or aryl. The term "protected amino" refers to such groups which may be converted to the amino group. The term "carboxamido" refers to the group —$CONH_2$ or to such a group substituted, in which each of the hydrogens is replaced by an alkyl or aryl group.

The term "carboxyl" refers to the group —COOH. The term "protected carboxyl" refers to such groups which may be converted into the carboxyl group, e.g., esters such as —COOR, wherein R is an alkyl group or an equivalent thereof, and others which may be known to a person skilled in the art of organic chemistry.

The term "trialkoxysilane" refers to a group of the general formula —Si(OR)$_3$, wherein each of the three R groups is an alkyl group, and may be the same or different, preferably, trimethoxysilane or triethoxysilane. Similarly, the term "trihalidesilane" refers to —SiX$_3$, wherein X is a halogen, each X may be same or different.

The expression "any two vicinal $R_5$-$R_{28}$ substituents" refers to any two substituents on the benzene rings, being ortho to one another. The expression "fused ring system" refers to at least two rings sharing one bond, such as in the case of naphthalene, phenanthrene, benzindole, benzpyridine and others. The fused ring system contains at least one benzene ring, being the ring of the compound of general formula I and another ring being formed by the ring closure of the any two vicinal $R_4$-$R_{27}$ substituents. The other ring may be saturated or unsaturated, substituted or unsubstituted and may be heterocylic.

The term "oxidation state", as used herein, refers to the electrically neutral state or to the state produced by the gain or loss of electrons to an element, compound or chemical substituent/subunit. In a preferred embodiment, this term refers to states including the neutral state and any state other than a neutral state caused by the gain or loss of electrons (reduction or oxidation).

The term "coordination compound" as used herein refers to any kind of compound that contains a coordination entity, i.e., an ion or neutral molecule that is composed of a central atom, usually of a metal, to which a surrounding array of atoms or groups of atoms, each of which is called a ligand, is attached (see e.g., Batten et al., 2012). Each one of ligands attached to said coordination entity may be a simple ion such as Cl$^-$, a small molecule such as $H_2O$ or $NH_3$, a larger molecule such as $H_2NCH_2CH_2NH_2$, $N(CH_2CH_2NH_2)_3$ or pyridyl, or a macromolecule, such as proteins. Non-limiting examples of coordination compounds include the above listed polypyridyl complexes, the metal-organic compounds of the formula $[M_1^{II}(2,2'$-bipyridine$)_3]^{2+}$ or $[M_1^{II}(2,2'$-bipyridine$)_2(4$-methyl-2,2'-bipyridine-pyridine$)]^{2+}$, wherein $M_1$ is Os, Fe, Ru, Mn, Cu, Co, Zn, Ni, Cr, Ti, V, Ir, or Rh, metallated corroles, and metallated porphyrins such as porphyrins of the general formula III as defined above.

The term "coordination polymer" as used herein refers to any system that forms 1D straight chain polymer network with carbon containing ligands bridging mononuclear, polynuclear or 1D coordination entities (see e.g., Batten et al., 2012).

The terms "metal-organic frameworks" (MOFs), "metal-organic polymers" and "metal-organic networks", as used herein interchangeably, refer to any system that forms a 2D or 3D network with carbon containing ligands bridging mononuclear, polynuclear or 1D coordination entities (see e.g., Batten et al., 2012). The metal-organic framework materials as such are described in, for example, U.S. Pat. No. 5,648,508; U.S. Pat. No. 7,637,983; U.S. Pat. No. 6,624,318; U.S. Pat. No. 7,799,120; EP-A-0 709 253; M. O'Keeffe et al., *J Sol. State Chem.*, 152 (2000) p. 3-20; H. Li et al., *Nature* 402 (1999) p. 276 seq.; M. Eddaoudi et al., *Topics in Catalysis* 9 (1999) p. 105-111; B. Chen et al., *Science* 291 (2001) p. 1021-23; Givaja et al, *Chem Soc Rev.*, 41, p. 115-147, (2012). An inexpensive way for the preparation of said materials is the subject of DE 10111230.0.

The term "organic electronics", "plastic electronics" or "polymer electronics" as used herein refers to a branch of electronics dealing with conductive polymers and conductive small molecules, which are carbon-based. Organic electronics relate to an area of technology that comprises applications as diverse as illuminants, photovoltaics, printed electronics and batteries, by replacing inorganic materials by organic materials, in particular conversion of light to electrical current (photovoltaics) and electrical current to light (light diodes).

The term "molecular electronics" as used herein refers to the design and construction of electronic devices consisting of a single molecule or small groups of molecules. These devices include components such as wires, rectifiers, switches, and memory devices.

The solid-state molecular chip can be prepared according to any present or future procedure of the art, for example, as disclosed by International Patent Applications published as WO 2011/141913 and WO 2009/095924.

The invention will now be illustrated by the following non-limiting Examples.

EXAMPLES

Materials and Methods

Figure 1B:
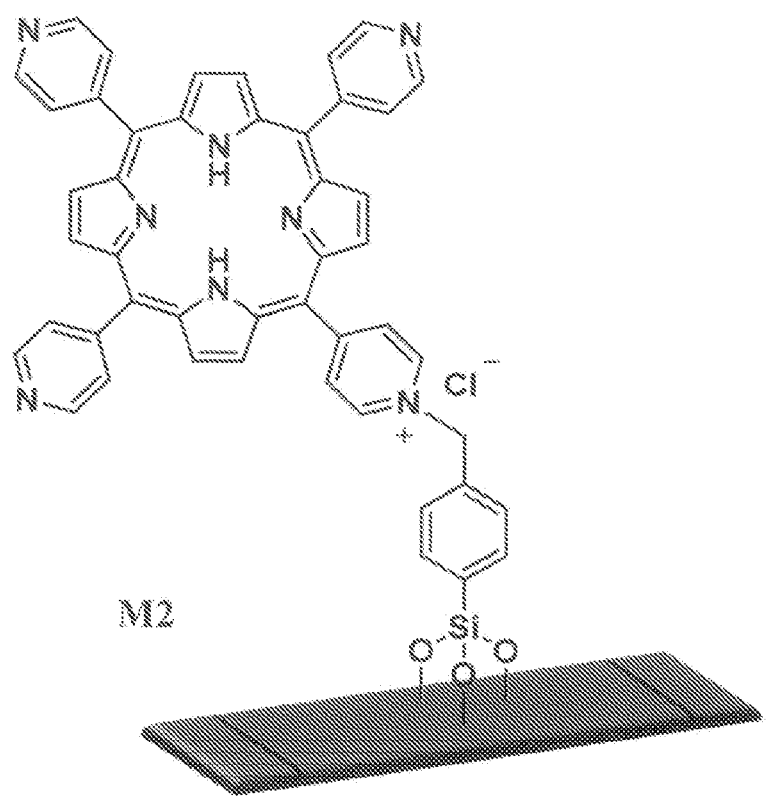

Monolayers M1 and M2 (FIGS. 1A-1B) were prepared according to known procedures (Gupta et al, 2006; Li et al, 1993; Yerushalmi et al, 2004). p-Chloromethyl-phenyl-trichlorosilane and 5,10,15,20-tetra(4-pyridyl)porphyrin were used as received and purchased from Gelest, Inc. and Sigma Aldrich, respectively. Solvents (AR grade) were purchased from Bio-Lab (Jerusalem), Frutarom (Haifa) or Mallinckrodt Baker (Phillipsburg, N.J.). Toluene was dried and purified using an M. Braun solvent purification system. Single-crystal silicon (100) substrates (2.0 cm×1.0 cm) were purchased from Wafernet (San Jose, Calif.) and Indium Tin Oxide (ITO) coated glass substrates (7.5 cm×0.8 cm) were purchased from Delta Technologies (Loveland, Colo.). The ITO and silicon substrates were cleaned by sonication in dichloromethane followed by sonication in toluene, then in acetone and ethanol, and subsequently dried under an $N_2$ stream; thereafter, they were cleaned for 30 min with an ultra violet ozone cleaning systems (UVOCS) (Montgomery, Pa.). Quartz (Chemglass, Inc.) substrates (2.0 cm×1.0 cm) were cleaned by immersion in a "piranha" solution (7:3 (v/v) $H_2SO_4$/30% $H_2O_2$) for 1 h. Subsequently, the substrates were rinsed with deionized (DI) water followed by the RCA cleaning protocol: 1:5:1 (v/v) $NH_4OH/H_2O$/30% $H_2O_2$ at 80° C. for 45 min. The substrates were washed with DI water and were dried under an $N_2$ stream. All substrates were then dried in an oven for 2 h at 130° C. The siloxane-based chemistry was carried out in a glovebox or by using standard schlenk-cannula techniques. Ultra/visible (UV/Vis) spectra were recorded on a Cary 100 spectrophotometer.

Nature of the Molecular Inputs ($In_1$-$In_4$)

$In_1$ is a 0.1 mM solution of KCl in DI water (15 mL).

$In_2$ is a solution of 2 M HCl in DI water (15 mL).

$In_3$ is a solution of saturated $NOBF_4$ (~20 mg) in dichloromethane (15 mL). Sonication for 2 min improved solubility. The solution was prepared inside a $N_2$-filled glovebox.

$In_4$ is a solution of 50 ppm (w/w) $K_2Cr_2O_7$ in 15 mL DI water, acidified with HCl to pH=0.

Example 1

Logic Operations with Monolayer M1

Figure 3A:
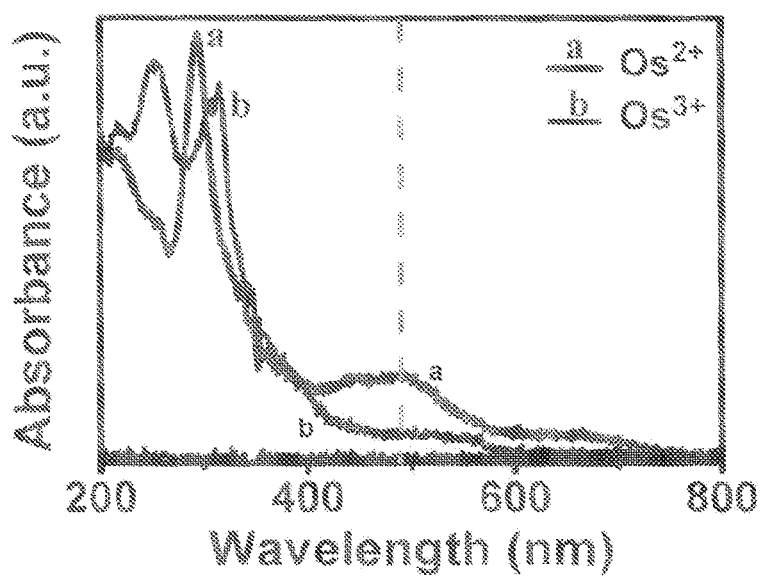
FIG. 3 shows an optical response of monolayers M1 and M2 after immersing monolayer M1 (FIG. 3A) into a saturated solution of $NOBF_4$ in dichloromethane for 3 minutes (blue trace, noted as 'b'), and monolayer M2 (FIG. 3B) in a 2 M aqueous solution of $H^+$ for 3 minutes (b). The traces noted as 'a' show the absorption spectra of the monolayers M1 and M2 in its reduced ($Os^{2+}$) state and un-protonated form, respectively. The dashed gray lines indicate the wavelength (495 and 465 nm) that was monitored for assignment of the logic 1 or 0, based on the ΔA of the M1- and M2-based monolayers.
Figure 4A:
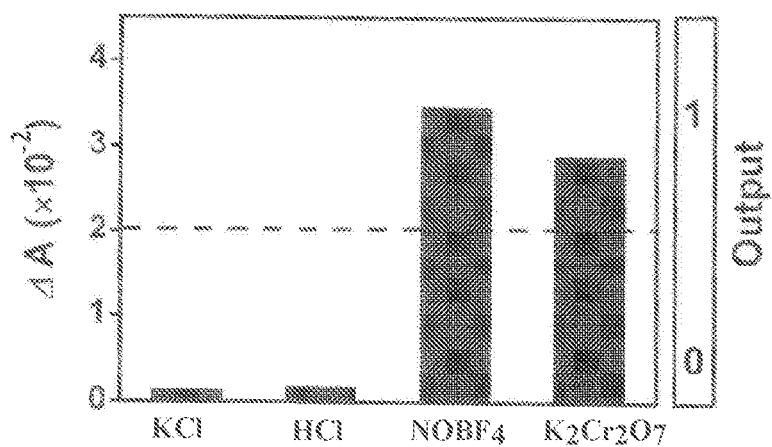
FIGS. 4A-4B show a response (ΔA) of the molecular chip M1 (FIG. 4A) or M2 (FIG. 4B) after applying the four different inputs ($In_1$-$In_4$ defined hereinafter) required for operating a molecular encoder. Table 1 hereinafter summarizes which reagent (input) is present, where 1 signifies present and 0 signifies absent.

Monolayer M1 is able to respond to various oxidizing agents. The consequent change in oxidation state from $Os^{2+} \rightarrow Os^{3+}$ is optically visible by bleaching of the metalto-ligand charge-transfer (MLCT) band at λ=495 nm. Thus, monolayer M1 was operated using the four above-mentioned inputs. The total volume of the solutions was 15 mL. The successive application of any of those afore-mentioned inputs yielded—in combination with the output of the monolayer M2—an output equivalent to the output of a molecular logic encoder (Table 1 and FIG. 2), as demonstrated next. The inputs were applied by immersing monolayer M1 for 3 min in each solution of inputs. After each input, the monolayer was carefully dried under a stream of $N_2$. If necessary, before applying the next input, the monolayer M1 was reduced to its original state by immersion in $H_2O$ (pH=7.5) for 5 min. FIG. 3A shows the oxidation of the monolayer M1 after immersing the monolayer in a saturated solution of $NOBF_4$ ($In_3$) in dichloromethane for 3 min. In these experiments the logical 1 was defined as the difference in absorption—before and after applying the input—of the metal-to-ligand charge-transfer (MLCT) band at λ=496 nm; $\Delta A = A_{before} - A_{after}$, exceeded a threshold value of $2 \times 10^{-2}$ (FIG. 4A). This eliminates noise and ensures high ON/OFF ratios, and hence only occurs if the metal centers in M1 are in the higher oxidation state ($Os^{3+}$).

Similar results were obtained when the monolayer M1 was immersed in a solution of $K_2CrO_4$ at pH=0. However, since M1 was only responsive to changes in the oxidation state, it did not respond to changes in pH. Immersing this monolayer in an acidic solution (pH=0), did not lead to changes in the intensity of the MLCT band. Accordingly, the monolayer is in state 1 only if inputs $In_3$ and $In_4$ are applied. This is summarized in FIG. 4A and FIG. 5.

Example 2

Logic Operations with Monolayer M2

Figure 3B:
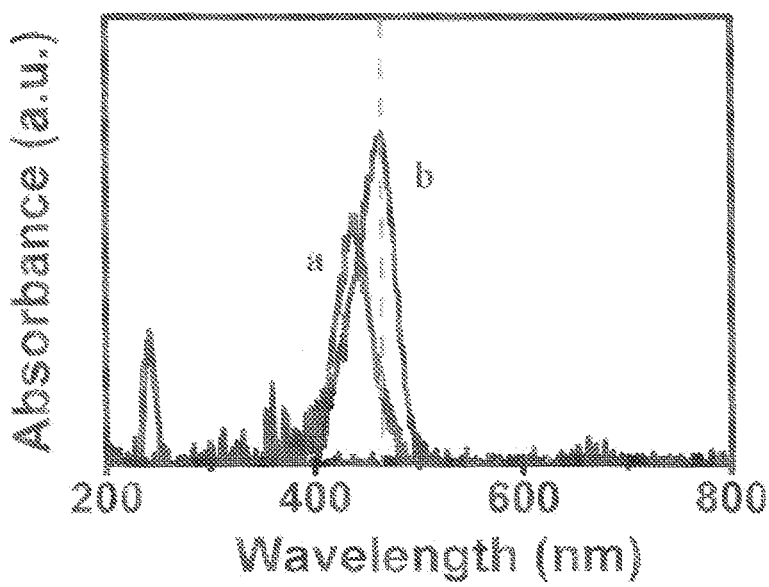
Figure 4B:
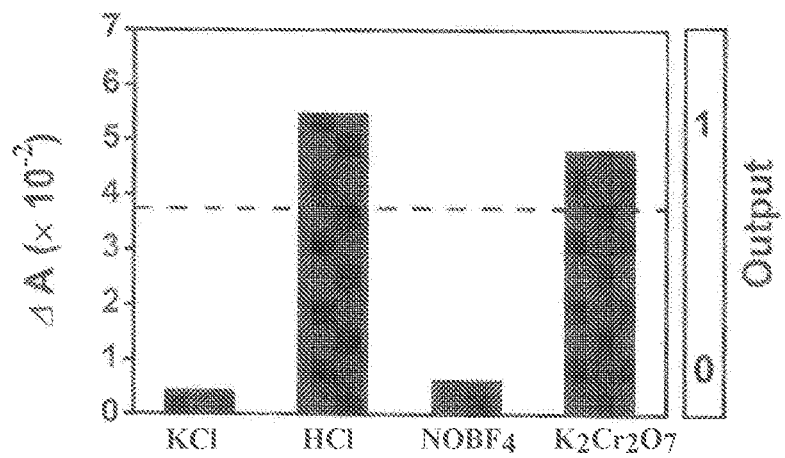
Figure 5:
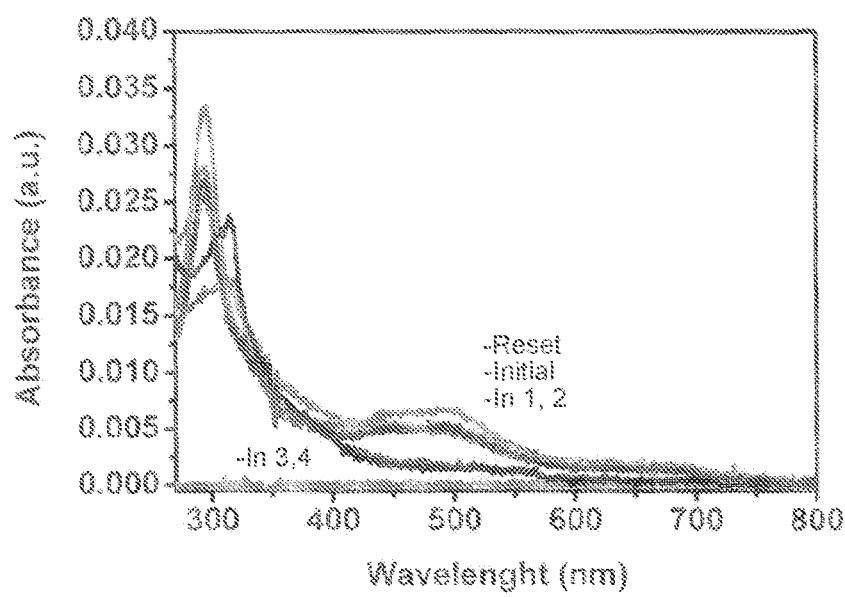
FIG. 5 shows absorption of the monolayer M1 upon applying Input 1: $Cl^-$, Input 2: $H^+$ (blue trace), Input 3: $NO^+$ and Input 4: $Cr^{6+}$ for 3 min. The two reset traces show the reset of the M1-based monolayer after applying inputs 3 and 4, respectively. The initial trace shows the initial absorption of monolayer M1.
Figure 6:
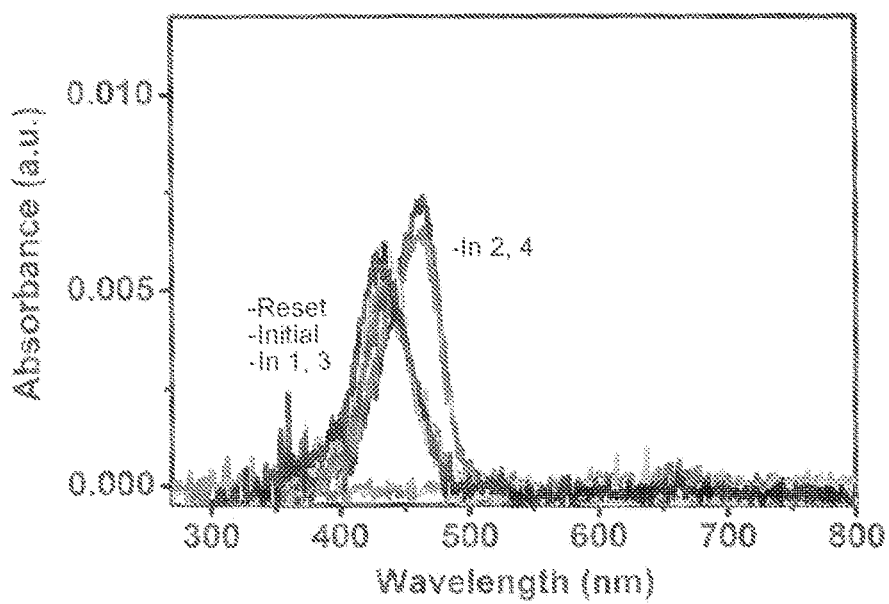
FIG. 6 shows absorption of the M2-based monolayer upon applying Input 1: $Cl^-$, Input 2: $H^+$, Input 3: $NO^+$ and Input 4: $Cr^{6+}$ for 3 minutes. The two reset traces show the reset of the monolayer after applying inputs 2 and 4, respectively. The initial red trace shows the initial absorption of monolayer M2.

In contrast to monolayer M1, monolayer M2 is able to respond to changes in the pH. This was recently exploited by Gulino et al. (2006) for the fabrication of a pH sensor on solid support. The inner core of the utilized porphyrin in M2, requires strongly acidic conditions in order to be protonated; pH<1. Monolayer M2 was operated using the four above-mentioned inputs. The total volume of the solutions was 15 mL. The successive application of any of those afore-mentioned inputs, yielded—in combination with the output of the monolayer M1—an output equivalent to the output of a molecular logic encoder (Table 1 and FIG. 2), as demonstrated next. The inputs were applied, by immersing monolayer M2 for 3 min in each solution of inputs. After each input, the monolayer was carefully dried under a stream of $N_2$. If necessary, before applying the next input, monolayer M2 was restored to its original state by immersion in $H_2O$ (pH=7.5) for 5 min. FIG. 3B shows the consequent change in the optical absorption upon protonation of M2—after immersion in a 2 M aqueous solution of $H^+$ ($In_2$) for 3 min. In these experiments the logical 1 was defined as the difference in absorption—before and after applying the input—of the Soret band at λ=465 nm; $\Delta A = A_{red} - A_{ox}$, exceeded a threshold value of $4 \times 10^{-2}$ (FIG. 4B). This eliminates noise, and ensures high ON/OFF ratios, and hence the output 1 will only occur if the monolayer M2 is protonated. This behavior pin-points the orthogonality of M1 and M2, where the latter monolayer is responsive to strongly acidic solutions and not to the here applied oxidizing agents, as is the case with M1 (FIGS. 5, 6). As a result the monolayer M2 only exhibited a logic 1, when inputs $In_2$ and $In_4$ were applied.

For $In_1$ and $In_3$ no change in the Soret band was observed. The output of the M2-based monolayer upon applying $In_1$-$In_4$ is shown in FIG. 4B and FIG. 6.

Example 3

Formation of a Molecular Encoder

The key idea was to regard the molecular monolayers, e.g. M1 and M2, as universal chips that act as individual logic gates, which can easily be combined into meaningful logic arrangements. This has many advantages because monolayers are physically separated from each other, do not show interference, can be read-out independently, are highly stable, and are robust to a wide variety of environmental conditions. We demonstrated that a combination of two orthogonal addressable monolayers can be used as molecular chips for mimicking a functional logic circuit, with subsequent control over the individual logic gates therein. The monolayers M1 and M2 were generated by covalently anchoring 5,10,15,20-tetra(4-pyridyl)porphyrin and $[Os(bpy)_2(mbpy-py)][PF_6]_2$ from solution to a quartz surface (FIGS. 1A-1B) (Gupta et al., 2006; Li et al., 1993). These molecular chips can be addressed chemically and behave as individual parts of the logic arrangement. Combining the optical output of these monolayers defines the overall operation as such. This set-up enabled, for the first time, to mimic the in/output behavior of a molecular encoder on solid support.

The 'plug and play' principle and the universality of the molecular chips was demonstrated since individually they do not mimic any useful logic function, although if desired, upon combination, they can be used for applications in molecular logic, which we demonstrated.

Figure 7:
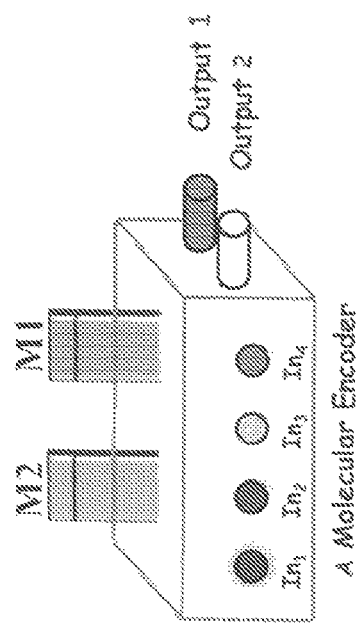
FIG. 7 shows a graphical illustration of the 'Plug and Play' concept with molecular chips M1 and M2. Only upon combining (plugging in) monolayers M1 and M2 with inputs $In_1$-$In_4$, does a molecular encoder result. Each monolayer independently does not result in an encoder.
Figure 7:
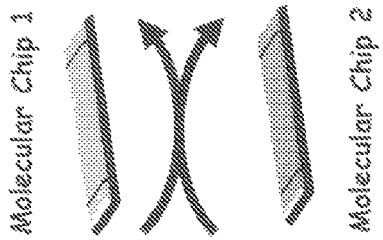
Figure 7:
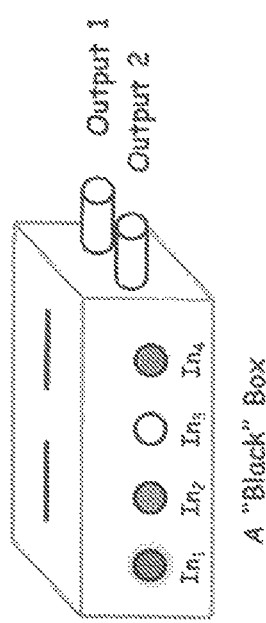

To accomplish the feature of combining different molecular logic gates into meaningful logic schemes, monolayers M1 and M2 were used for demonstrating the 'plug and play' principle in a molecular encoder, which is illustrated in FIG. 7. A molecular encoder is a device that can compress information, effectively storing the same amount of information in fewer bits. For instance, a 4:2 encoder converts the same amount of information present in four bits into an output of only 2 bits. Therefore, an encoder has four different inputs—with the restriction that they cannot be active at the same time—and two outputs A and B ($Out_A$ and $Out_B$, respectively). In addition, there was also extra output that is called the validation output. This validated the active operation of encoder when one of the inputs was active, i.e. it gave a logic 1 when one encoder is 'ON', and a logic 0 when encoder is 'OFF'. This output, generated by the OR gate did not take part in the actual encoding of the information itself, but merely resulted from applying the inputs (Mano et al., 2000). For correct operation of the 4:2 molecular encoder, the order in which the inputs are applied does not affect the operation of the molecular encoder. In our case this was evident as the monolayers that constitute the encoder were reset to their original state before applying the next input. The truth-table and logic circuit of an encoder are shown in Table 1 and FIG. 2, respectively. The inputs used are $In_1$-$In_4$, listed above.

TABLE 1

Truth-table of a molecular 4:2 encoder consisting M1 and M2 operating with four inputs ($In_1$-$In_4$).

| Entry | Inputs | | | | Output | | V |
|---|---|---|---|---|---|---|---|
| | $In_1$ | $In_2$ | $In_3$ | $In_4$ | $Out_A$ | $Out_B$ | |
| 1 | 1 | 0 | 0 | 0 | 0 | 0 | 1 |
| 2 | 0 | 1 | 0 | 0 | 0 | 1 | 1 |
| 3 | 0 | 0 | 1 | 0 | 1 | 0 | 1 |
| 4 | 0 | 0 | 0 | 1 | 1 | 1 | 1 |

Figure 2:
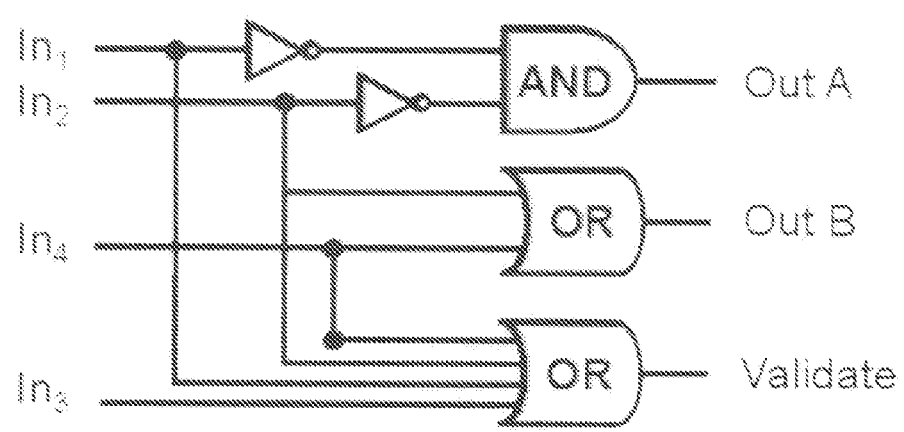
FIG. 2 shows a logic circuit of a 4:2 encoder, operating with four inputs ($In_1$-$In_4$), according to truth-table in Table 1, herein after.

The outputs A and B correspond to the outputs of the two different logic gates in the logic circuit of the encoder (FIG. 2).

Since reactivity of the monolayers M1 and M2 is orthogonal, with respect to certain stimuli ($In_1$-$In_4$), the monolayers will respond differently to the four applied inputs.

The Os metal-centers in M1 ensure that this monolayer will be operated according to its redox chemistry, whereas the porphyrin in M2 can be addressed by (de)protonation of the pyridine moieties attached to the porhyrin-core. For example, monolayer M1 is able to respond to various oxidizing agents, while M2 is only responsive to strongly acidic solutions and not to oxidizing agents.

To ensure that both monolayers are responsive to $In_4$, ($K_2CrO_4$), we use the fact that the oxidation of $Os^{2+}$ occurs predominantly at low pH values. Protonation of the inner core's nitrogen atoms of M2 occurs under the strong acidic conditions as well (pH<1) (Yerushalmi et al., 2004). Although one might argue in this case that $In_3$ will be active as well, the system responds in such a way that $In_4$ receive priority only over $In_3$, resulting in logic 1 for M1 and M2. The output of monolayer M2 upon applying $In_1$-$In_4$ is shown in FIG. 4B and FIG. 6.

As monolayers M1 and M2 are operated selectively with four identical inputs and can be addressed independently, the outputs of M1 and M2 (FIGS. 4A-4B) correspond to the outputs ($Out_A$) and ($Out_B$) of the 4:2 encoder (Table 1). Note that there is no special sequence or order in which the monolayer is read-out. Each monolayer M1 or M2 was addressed individually and read-out individually. As a result each monolayer performed a single simple logic operation in the logic circuit of the encoder. Thus, by plugging two independent molecular monolayers into an arrangement of four inputs; a fully functional and playable logic function results. The entire system can be reset by washing M1 and M2 with $H_2O$ (pH=7.5) for 5 min.

The orthogonal reactivity of the chips of the invention to the applied chemical inputs allowed specific addressing of M1 and M2 with an independent and interference-free read-out. It is reasonable to assume that the method presented here can be expanded to a plethora of different molecular chips that can be designed—when combined with other molecular chips—to produce functional logic schemes. The advantage of this is a large variety and degree of freedom in designing the logic function, without the need for synthesizing new molecules. Just combining two chips can lead to interesting integrated molecular logic. In addition, the siloxane-based monolayers such as M1, are thermally, chemically, electrochemically robust, stable towards pH gradients and to a wide variety of environmental conditions.

In conclusion, we have shown a new method for fabricating functional logic schemes with a solid state setup. The formation of the logic scheme depends on the combination of different self-assembled monolayers on surfaces. Monolayers of M1 and M2 were able to respond to four different inputs and, by doing so, were able to mimic collectively the first molecular encoder on solid support.

Figure 8:
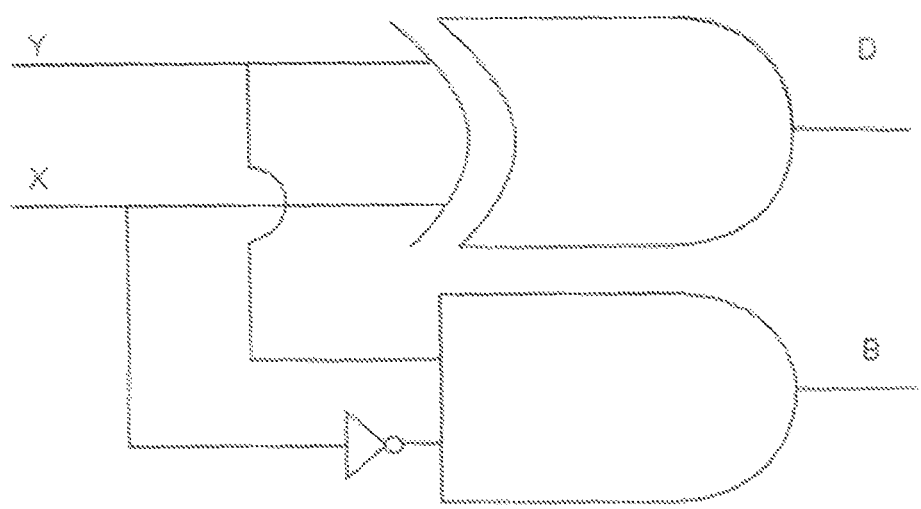
FIG. 8 shows a logic circuit of a half-subtractor operating with two inputs (X-Y), according to truth-table in Table 2.

A half-subtractor is a logic circuit which is used for subtracting one single bit binary number from another single bit binary number. The half-subtractor is a combinational circuit which is used to perform subtraction of two bits. It has two inputs, X (minuend) and Y (subtrahend) and two outputs D (difference) and B (borrow). The truth-table and logic circuit of a half-substractor is shown in Table 2 and FIG. 8, respectively.

TABLE 2

Truth-table of a half-subtractor operating with two inputs (X and Y).

| X | Y | D | B |
|---|---|---|---|
| 0 | 0 | 0 | 0 |
| 0 | 1 | 1 | 1 |
| 1 | 0 | 1 | 0 |
| 1 | 1 | 0 | 0 |

REFERENCES

Batten S. R., Champness N. R., Chen X. M., Garcia-Martinez J., Kitagawa S., Ohrstrom L., O'Keeffe M., Suhh M. P., Reedijki J., *CrystEngComm*, 2012, 14, 3001

Gulino, P. Mineo, E. Scamporrino, D. Vitalini, I. Fragala, *Chem. Mater.* 2006, 18, 2404.

Gulino, A., Bazzano, S., Mineo, P., Camporrino, E., Vitalini, D., Fragalà, I., *Chem. Mater.* 2005, 17, 4043.

Gupta T., Altman M., Shukla A. D., Freeman D., Leitus G., van der Boom M. E., *Chem. Mater.* 2006, 18, 1379.

Li D. Q., Swanson B. I., Robinson J. M., Hoffbauer M. A., *J. Am. Chem. Soc.* 1993, 115, 6975.

Mano, M. M., Kime, C. R., *Logic and Computer Design Fundamentals*, $4^{th}$ ed., Prentice Hall, Upper Saddle River, N.J., 2000.

Yerushalmi R., Scherz A., van der Boom M. E., *J. Am. Chem. Soc.* 2004, 126, 2700.

The invention claimed is:

1. A logic circuit for performing a logic operation such that predetermined inputs to the logic circuit produce a logical output according to said logic operation, comprising:
   a plurality of predetermined solid-state molecular chips, each molecular chip comprising a layer of an active compound confined to a solid support, each molecular chip having multiple states, each state being obtained after application of a corresponding input, each state being read electrically, optically, electro-chemically or any combination thereof; wherein said active compound on at least one of said molecular chips is different from said active compound on at least another of said molecular chips;
   a plurality of predetermined inputs,
   such that after applying said predetermined inputs on said predetermined molecular chips, reading the states of said plurality of molecular chips produces a logical output according to said logic operation.

2. The logic circuit of claim 1, wherein each of said plurality of molecular chips comprises one or more layers of one or more active compounds coupled to said layer of an active compound.

3. The logic circuit of claim 1, wherein the states of the plurality of the molecular chips are read optically, magnetically, electrically, or electrochemically, based on changes in conductivity, magnetism, current, absorption, refractive index readout, Infra-Red (IR) readout or Near IR (NIR) readout.

4. The logic circuit of claim 1, wherein said input comprises application of an electric current, application of an electric/magnetic field, immersion in a solution, or any combination thereof.

5. The logic circuit of claim 4, wherein said input comprises immersion in a solution and wherein said solution is (i) an acidic solution of organic or mineral acid or oxoacid; (ii) a basic solution of organic or inorganic base; (iii) a solution comprising an oxidizing or reducing agent; or (iv) a solution comprising a metal ion, an anion, an organic cation, or a gas.

6. The logic circuit of claim 5, wherein said input comprises immersion in a solution and wherein said solution is (i) an acidic solution of organic or mineral acid or oxoacid; (ii) a basic solution of organic or inorganic base; (iii) a solution comprising an oxidizing or reducing agent; or (iv) a solution comprising a metal ion, an anion, an organic cation, or a gas, and wherein:
  (i) said organic acid is selected from the group consisting of acetic acid, propionic acid, butyric acid, formic acid, oxalic acid, glycolic acid, citric acid, succinic acid, ascorbic acid, lactic acid, salicylic acid, pivalic acid, diethylacetic acid, malonic acid, benzoic acid, phenylpropionic acid, pimelic acid, fumaric acid, maleic acid, malic acid, gluconic acid, isonicotinic acid, sulfaminic acid, adipic acid, para-toluenesulfonic acid, naphthalenedisulfonic acid, uric acid, oxalic acid, sulfonic acid, tartaric acid, and a mixture thereof;
  (ii) said mineral acid or oxoacid is selected from the group consisting of HCl, HBr, HI, $HNO_3$, $H_2SO_4$, $H_3PO_4$, $HClO_4$, $HBrO_4$, $HIO_4$, $HBF_4$, $H_3BO_3$, and $HPF_6$; a derivative of aforesaid selected from the group consisting of $HNO_2$, $H_3PO_2$, $H_2SO_3$, $H_2SO_2$, $HClO_3$, $HClO_2$, $HClO$, $HBrO_3$, $HBrO_2$, $HBrO$, $HIO_3$, $HIO_2$, $HIO$, and $HBO_2$; and an acid solution of $PCl_5$ or $PO_5$;
  (iii) said organic base is selected from the group consisting of a pyridine, imidazole, benzimidazole, amine, and hystidine;
  (iv) said inorganic base is selected from the group consisting of:
    an alkali hydroxide selected from the group consisting of LiOH, NaOH, KOH, and CsOH;
    a metal hydroxide selected from the group consisting of aluminium hydroxide, beryllium hydroxide, cobalt(II) hydroxide, copper(II) hydroxide, gold(III) hydroxide, iron(II) hydroxide, mercury(II) hydroxide, nickel(II) hydroxide, tin(II) hydroxide, zinc hydroxide, and zirconium(IV) hydroxide;
    a metal oxide/hydroxide including FeOOH;
    a carbonate selected from the group consisting of lithium carbonate, sodium carbonate, and potassium carbonate;
    a bicarbonate selected from the group consisting of lithium bicarbonate, sodium bicarbonate, and potassium bicarbonate;
    ammonia; and
    a metal amide selected from the group consisting of lithium amide, sodium amide, and potassium amide;
  (v) said oxidizing agent is selected from the group consisting of $K_2CrO_4$, $KMnO_4$, $NaMnO_4$, $OsO_4$, $NOBF_4$, $FeCl_3$, $H_2SO_5$, $H_2SO_8$, $N_2O$, $HNO_3$, $Ag_2O$, oxygen, ozone, $H_2O_2$, sodium perborate, $F_2$, $Br_2$, $Cl_2$, $I_2$, $ClO_2^-$, $ClO_3^-$, and $HClO_4$;
  (vi) said reducing agent is selected from the group consisting of sodium sulfide, dithiothreitol, lithium aluminium hydride, sodium borohydride, sodium amalgam (Na(Hg)), zinc-mercury amalgam (Zn(Hg)), diisobutylaluminum hydride (DIBAH), $Sn^{2+}$, and $Fe^{2+}$;
  (vii) said metal ion is selected from the group consisting of an ion of Li, Na, K, Rb, Cs, Fr, Mg, Ca, Sr, Ba, Ra, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg, Al, Ga, In, Tl, Ge, Sn, Pb, As, Sb, Bi, Se, and Te;
  (viii) said anion is selected from the group consisting of cyanide, carbonate, nitrate, nitrite, phosphate, phosphite, sulfide, sulfphate, sulphite, chloride, bromide, iodide, fluoride, and a derivative thereof;
  (ix) said organic cation is a quaternary ammonium compound of the formula $N(R')_4^+$, wherein R' each independently is H, or $(C_1-C_{10})$alkyl; and
  (x) said gas is selected from the group consisting of CO, $CO_2NO$, $Cl_2$, $Br_2$, He, Ne, and Ar.

7. The logic circuit of claim 1, wherein said active compound each independently comprises: an organic, metal-organic, inorganic, polymeric, or coordination compound, or metal-organic framework/network/polymer.

8. The logic circuit of claim 7, wherein said active compound comprises metal-organic compound and wherein said metal-organic compound is a polypyridyl complex of the general formula I:

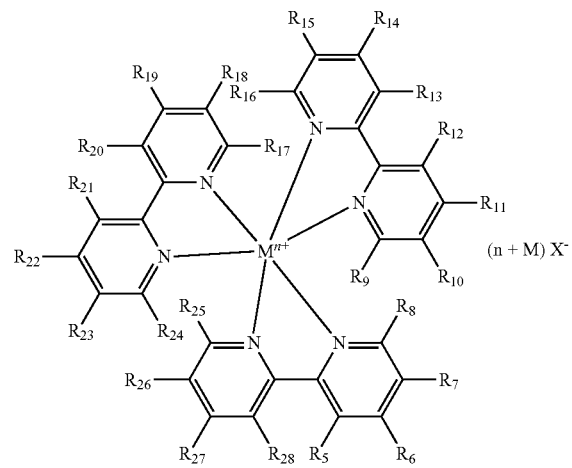

wherein M is Os, Fe, Ru, Mn, Cu, Zn, Ni, Cr, Ti, V, Ir, or Rh;
  n is the formal oxidation state of M, wherein n is 0 to 4; m is the positive charge of the tris-bipyridyl ligand, wherein m is an integer from 0 to 24, X is a counter anion selected from the group consisting of $Br^-$, $Cl^-$, $F^-$, $F^-$, $I^-$, $PF_6^-$, $BF_4^-$, $OH^-$, $ClO_4^-$, $SO_3^-$, $CF_3COO^-$, $CN^-$, alkyl$COO^-$, aryl$COO^-$ and a combination thereof; and $R_5$ to $R_{28}$ each independently is selected from the group consisting of hydrogen, halogen, hydroxyl, azido, nitro, cyano, amino, substituted amino, thiol, $C_1$-$C_{10}$ alkyl, cycloalkyl, heterocycloalkyl, haloalkyl, aryl, heteroaryl, alkoxy, alkenyl, alkynyl, carboxamido, substituted carboxamido, carboxyl, protected carboxyl, protected amino, sulfonyl, substituted aryl, substituted cycloalkyl and substituted heterocycloalkyl, wherein at least one of said $R_5$ to $R_{28}$ is a group A linked to the ring structure of the compound of general formula I via $R_4$, or B linked to the ring structure of the compound of general formula I via the oxygen:

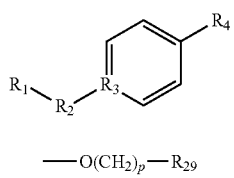

A

—O(CH$_2$)$_p$—R$_{29}$

B wherein

R$_4$ is selected from the group consisting of cis/trans C=C, C≡C, N=N, C=N, N=C, C—N, N—C, alkylene, arylene and a combination thereof; R$_3$ is C or N; R$_2$ is absent or is selected from the group consisting of hydrogen, alkyl, alkylene, aryl, arylene, OH, O-alkyl, O-alkylene and a combination thereof; and R$_1$ is absent or is selected from the group consisting of hydrogen, trialkoxysilane, trihalidesilane, thiol, COOH, COO—, Si(OH)$_3$, Si(OEt)$_3$, Si(OMe)(Me)$_2$, SiCl$_3$, SiMe$_2$Cl, zirconate, sulfate, and phosphonate; and p is an integer from 9 to 12; and R$_{29}$ is selected from the group consisting of hydrogen, trialkoxysilane, trihalidesilane, thiol, COOH, COO—, Si(OH)$_3$, Si(OEt)$_3$, Si(OMe)(Me)$_2$, SiCl$_3$, SiMe$_2$Cl, zirconate, sulfate, and phosphonate; and any two vicinal $R_5$-$R_{28}$ substituents, together with the carbon atoms to which they are attached, may form a fused ring system selected from the group consisting of cycloalkyl, heterocycloalkyl, heteroaryl and aryl, wherein said fused system may be substituted by one or more groups selected from the group consisting of $C_1$-$C_{10}$ alkyl, aryl, azido, cycloalkyl, halogen, heterocycloalkyl, alkoxy, hydroxyl, haloalkyl, heteroaryl, alkenyl, alkynyl, nitro, cyano, amino, substituted amino, carboxamido, substituted carboxamido, carboxyl, protected carboxyl, protected amino, thiol, sulfonyl and substituted aryl; and said fused ring system may also contain at least one heteroatom selected from the group consisting of N, O and S.

9. The logic circuit of claim 8, wherein said active compound comprises metal-organic compound and wherein said metal-organic compound is a polypyridyl complex and wherein said polypyridyl complex is the compound of the general formula I, wherein M is Os, n is 2, m is 1, X is PF$_6^-$ or I$^-$, $R_5$, $R_7$ to $R_{26}$ and $R_{28}$ each is hydrogen, $R_6$ is methyl, and $R_{27}$ is A, wherein $R_4$ is C=C, $R_3$ is N, $R_2$ is propyl, and $R_1$ is trimethoxysilane, herein identified compounds 1a and 1b, respectively

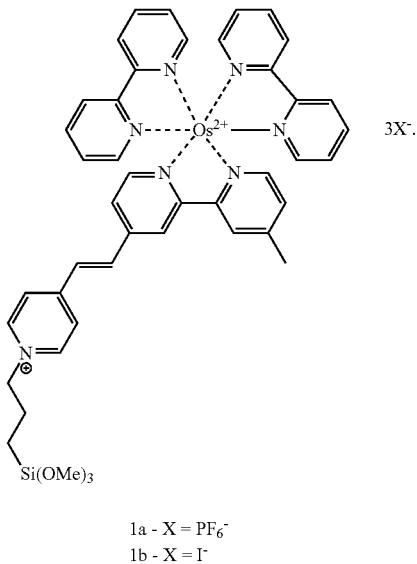

1a - X = PF$_6^-$
1b - X = I$^-$

10. The logic circuit of claim 7, wherein said active compound comprises metal-organic compound and wherein said metal-organic compound is [M$_1^{II}$(2,2'-bipyridine)$_3$]$^{2+}$ or [M$_1^{II}$(2,2'-bipyridine)$_2$(4-methyl-2,2'-bipyridine-pyridine)]$^{2+}$, wherein M$_1$ is Os, Fe, Ru, Mn, Cu, Co, Zn, Ni, Cr, Ti, V, Ir, or Rh.

11. The logic circuit of claim 7, wherein said active compound comprises an organic compound and wherein said organic compound is selected from the group consisting of (i) viologen (4, 4'-bipyridylium salts); (ii) azole compounds; (iii) azo compounds including azobenzenes; (iv) aromatic amines; (v) carbazoles; (v) cyanines; (vi) methoxybiphenyls; (vii) quinones; (viii) thiazines; (ix) pyrazolines; (x) tetracyanoquinodimethanes (TCNQs); (xi) tetrathiafulvalene (TTF); (xii) porphyrins; (xiii) corroles; (xiv) phtalocyanines; (xv) diarylethenes including stilbenes; (xvi) dithienylethenes, (xvii) fulgides; (xviii) spiropyrans; (xix) phenoxynaphthacene quinines; and (xx) derivatives of compounds defined in (i)-(xix).

12. The logic circuit of claim 11, wherein said active compound comprises an organic compound and wherein said organic compound is a porphyrin and wherein said porphyrin is of the general formula II or III:

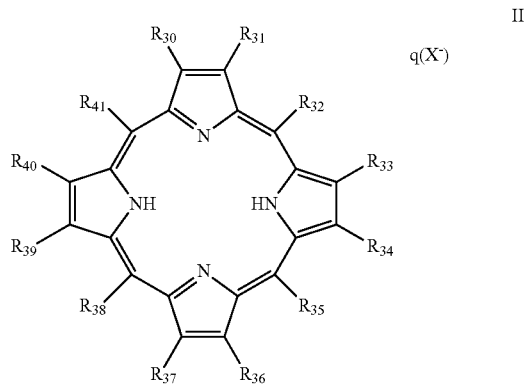

II q(X$^-$)

-continued

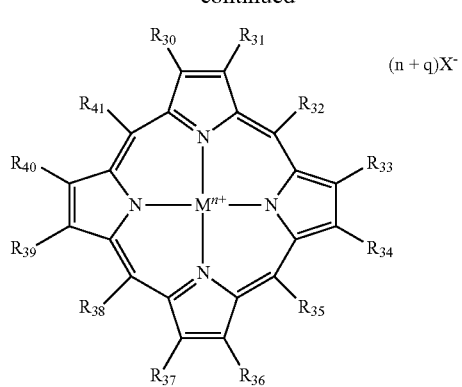

wherein

M is Os, Fe, Ru, Mn, Cu, Zn, Ni, Cr, Ti, V, Ir, or Rh;

n is the formal oxidation state of M, wherein n is 0 to 4;

q is the overall positive charge of the $R_{30}$ to $R_{41}$ groups, wherein q is an integer from 0 to 12;

X is a counter anion selected from the group consisting of $Br^-$, $Cl^-$, $F^-$, $I^-$, $PF_6^-$, $BF_4^-$, $OH^-$, $ClO_4^-$, $SO_3^-$, $CF_3COO^-$, $CN^-$, $alkylCOO^-$, $arylCOO^-$, and a combination thereof; and $R_{30}$ to $R_{41}$ each independently is selected from the group consisting of hydrogen, halogen, hydroxyl, azido, nitro, cyano, amino, substituted amino, thiol, $C_1$-$C_{10}$ alkyl, cycloalkyl, heterocycloalkyl, haloalkyl, aryl, heteroaryl, alkoxy, alkenyl, alkynyl, carboxamido, substituted carboxamido, carboxyl, protected carboxyl, protected amino, sulfonyl, substituted aryl, substituted cycloalkyl and substituted heterocycloalkyl, wherein at least one of said $R_{30}$ to $R_{41}$ is a group A linked to the porphyrin of general formula II or III via $R_4$, or B linked to the porphyrin of general formula II or III via the oxygen:

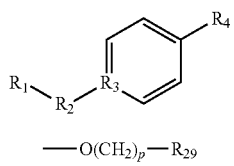

wherein $R_4$ is absent or selected from the group consisting of cis/trans C=C, C≡C, N=N, C=N, N=C, C—N, N—C, alkylene, arylene and a combination thereof; $R_3$ is C or N; $R_2$ is absent or is selected from the group consisting of hydrogen, alkyl, alkylene, aryl, arylene, OH, O-alkyl, O-alkylene and a combination thereof; and $R_1$ is absent or is selected from the group consisting of hydrogen, trialkoxysilane, trihalidesilane, thiol, COOH, COO—, $Si(OH)_3$, $Si(OEt)_3$, $Si(OMe)(Me)_2$, $SiCl_3$, $SiMe_2Cl$, zirconate, sulfate, and phosphonate;

p is an integer from 9 to 12;

$R_{29}$ is selected from the group consisting of hydrogen, trialkoxysilane, trihalidesilane, thiol, COOH, COO—, $Si(OH)_3$, $Si(OEt)_3$, $Si(OMe)(Me)_2$, $SiCl_3$, $SiMe_2Cl$, zirconate, sulfate, and phosphonate; and any two vicinal $R_{30}$-$R_{41}$ substituents, together with the carbon atoms to which they are attached, may form a fused ring system selected from the group consisting of cycloalkyl, heterocycloalkyl, heteroaryl and aryl, wherein said fused system may be substituted by one or more groups selected from the group consisting of $C_1$-$C_{10}$ alkyl, aryl, azido, cycloalkyl, halogen, heterocycloalkyl, alkoxy, hydroxyl, haloalkyl, heteroaryl, alkenyl, alkynyl, nitro, cyano, amino, substituted amino, carboxamido, substituted carboxamido, carboxyl, protected carboxyl, protected amino, thiol, sulfonyl and substituted aryl; and said fused ring system may also contain at least one heteroatom selected from the group consisting of N, O and S.

13. The logic circuit of claim 12, wherein said porphyrin is the compound of the general formula II, wherein $R_{30}$, $R_{31}$, $R_{33}$, $R_{34}$, $R_{36}$, $R_{37}$, $R_{39}$ and $R_{40}$ each is H; $R_{32}$, $R_{38}$ and $R_{41}$ each is 4-pyridyl; and $R_{35}$ is A, wherein $R_4$ is absent, $R_3$ is N, $R_2$ is —$CH_2$-phenyl and $R_1$ is —$Si(Cl)_3$, herein identified compound 2:

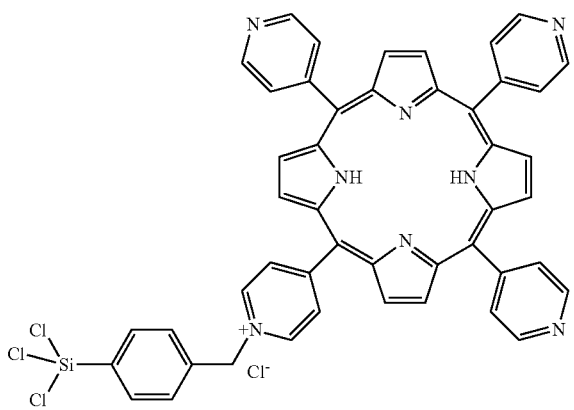

14. The logic circuit of claim 7, wherein said active compound comprises an inorganic compound and wherein said inorganic compound comprises tungsten oxide, iridium oxide, vanadium oxide, nickel oxide, molybdenum oxide, titanium oxide, manganese oxide, niobium oxide, copper oxide, tantalum oxide, rhenium oxide, rhodium oxide, ruthenium oxide, iron oxide, chromium oxide, cobalt oxide, cerium oxide, bismuth oxide, tin oxide, praseodymium, bismuth, lead, silver, lanthanide hydrides ($LaH_2/LaH_3$), nickel doped $SrTiO_3$, indium nitride, ruthenium dithiolene, phosphotungstic acid, ferrocene-naphthalimides dyads, organic ruthenium complexes, or any mixture thereof.

15. The logic circuit of claim 7, wherein said active compound comprises a polymeric compound and wherein said polymeric compound comprises a conducting polymer selected from the group consisting of a polypyrrole, polydioxypyrrole, polythiophene, polyaniline, poly(acetylene), poly(p-phenylene sulfide), poly(p-phenylene vinylene) (PPV), polyindole, polypyrene, polycarbazole, polyazulene, polyazepine, poly(fluorene), polynaphthalene, polyfuran, a metallopolymeric film based on a polypyridyl complex and a polymeric viologen system comprising pyrrole-substituted viologen pyrrole, disubstituted viologen, N,N'-bis(3-pyrrol-1-ylpropyl)-4,4'-bipyridylium, or a derivative of said conducting polymer.

16. The logic circuit of claim 1, wherein the solid support is a material selected from the group consisting of glass, a doped glass, indium tin oxide (ITO)-coated glass, silicon, a doped silicon, Si(100), Si(111), $SiO_2$, SiH, silicon carbide mirror, quartz, a metal, metal oxide, a mixture of metal and metal oxide, group IV elements, mica, a graphite comprising intercalated metal cations, a polymer selected from the group consisting of polyacrylamide and polystyrene, a plastic, a zeolite, a clay, a membrane, an optical fiber, a ceramic, a metalized ceramic, an alumina, an electrically-conductive material, a semiconductor, steel, and a stainless steel.

17. The logic circuit of claim 1, wherein said plurality of molecular chips ($n_1$) are applied a plurality of inputs ($n_2$), producing one or more output information streams ($n_3$) representing the predetermined logical output of said logic circuit, such that $n_1 < n_2$ and $n_3 \leq n_1$.

18. The logic circuit of claim 1, wherein said plurality of molecular chips perform one or more of the following logic operations: AND, OR, NOT, XOR, NAND, NOR, XNOR, or any combination thereof.

19. The logic circuit of claim 1, wherein said plurality of molecular chips operate using Boolean Logic, Sequential Logic, a combination of Boolean Logic and Sequential Logic.

20. The logic circuit of claim 1, wherein said plurality of molecular chips operate as a sensor, an encoder, a decoder, a set/reset latch, a memory element or a multistate memory element.

21. The logic circuit of claim 1, wherein said plurality of molecular chips operate using base 2, base 3, base 4, base 5, base 6, base 7, base 8, base 9, base 10, base 16 or any combination thereof.

22. The logic circuit of claim 1, wherein said plurality of molecular chips operate using light.

23. The logic circuit of claim 1, wherein said plurality of molecular chips operate using organic electronics, molecular electronics or a combination thereof.

24. A logic circuit performing a logic operation, for the detection of inputs to the logic circuit, comprising:
  a plurality of predetermined solid-state molecular chips, each molecular chip comprising a layer of an active compound confined to a solid support, each molecular chip having multiple states, each state being obtained after application of a corresponding input, each state being read electrically, optically, electro-chemically or any combination thereof;
  wherein said active compound on at least one of said molecular chips is different from said active compound on at least another of said molecular chips;
  a logical output obtained by reading the states of said plurality of molecular chips after application of said inputs,
  such that knowing the logical output which can only be obtained after application of predetermined inputs on said plurality of molecular chips produces the detection of said inputs.

25. The logic circuit of claim 24, wherein said inputs comprise an electric current, an electric/magnetic field, or immersion in a solution, or any combination thereof.

26. The logic circuit of claim 25, wherein said input comprises immersion in a solution and wherein said solution is (i) an acidic solution of organic or mineral acid or oxoacid; (ii) a basic solution of organic or inorganic base; (iii) a solution comprising an oxidizing or reducing agent; or (iv) a solution comprising a metal ion, an anion, an organic cation, or a gas.

27. The logic circuit of claim 26, wherein said input comprises immersion in a solution and wherein said solution is (i) acidic solution of organic or mineral acid or oxoacid; (ii) a basic solution of organic or inorganic base; (iii) a solution comprising an oxidizing or reducing agent; or (iv) a solution comprising a metal ion, an anion, an organic cation, or a gas and wherein:
  (i) said organic acid is selected from the group consisting of acetic acid, propionic acid, butyric acid, formic acid, oxalic acid, glycolic acid, citric acid, succinic acid, ascorbic acid, lactic acid, salicylic acid, pivalic acid, diethylacetic acid, malonic acid, benzoic acid, phenylpropionic acid, pimelic acid, fumaric acid, maleic acid, malic acid, gluconic acid, isonicotinic acid, sulfaminic acid, adipic acid, para-toluenesulfonic acid, naphthalenedisulfonic acid, uric acid, oxalic acid, sulfonic acid, tartaric acid, and a mixture thereof;
  (ii) said mineral acid or oxoacid is selected from the group consisting of HCl, HBr, HI, $HNO_3$, $H_2SO_4$, $H_3PO_4$, $HClO_4$, $HBrO_4$, $HIO_4$, $HBF_4$, $H_3BO_3$, and $HPF_6$; a derivative of the aforesaid selected from the group consisting of $HNO_2$, $H_3PO_2$, $H_2SO_3$, $H_2SO_2$, $HClO_3$, $HClO_2$, HClO, $HBrO_3$, $HBrO_2$, HBrO, $HIO_3$, $HIO_2$, HIO, and $HBO_2$; and an acid solution of $PCl_5$ or $PO_5$;
  (iii) said organic base is selected from the group consisting of a pyridine, imidazole, benzimidazole, amine, and hystidine;
  (iv) said inorganic base is selected from the group consisting of:
  an alkali hydroxide selected from the group consisting of LiOH, NaOH, KOH, and CsOH;
  a metal hydroxide selected from the group consisting of aluminium hydroxide, beryllium hydroxide, cobalt(II) hydroxide, copper(II) hydroxide, gold(III) hydroxide, iron(II) hydroxide, mercury(II) hydroxide, nickel(II) hydroxide, tin(II) hydroxide, zinc hydroxide, and zirconium(IV) hydroxide;
  a metal oxide/hydroxide including FeOOH;
  a carbonate selected from the group consisting of lithium carbonate, sodium carbonate, and potassium carbonate;
  a bicarbonate selected from the group consisting of lithium bicarbonate, sodium bicarbonate, and potassium bicarbonate;
  ammonia; and
  a metal amide selected from the group consisting of lithium amide, sodium amide, and potassium amide;
  (v) said oxidizing agent is selected from the group consisting of $K_2CrO_4$, $KMnO_4$, $NaMnO_4$, $OsO_4$, $NOBF_4$, $FeCl_3$, $H_2SO_5$, $H_2SO_8$, $N_2O$, $HNO_3$, $Ag_2O$, oxygen, ozone, $H_2O_2$, sodium perborate, $F_2$, $Br_2$, $Cl_2$, $I_2$, $ClO_2^-$, $ClO_3^-$, and $HClO_4$;
  (vi) said reducing agent is selected from the group consisting of sodium sulfide, dithiothreitol, lithium aluminium hydride, sodium borohydride, sodium amalgam (Na(Hg)), zinc-mercury amalgam (Zn(Hg)), diisobutylaluminum hydride (DIBAH), $Sn^{2+}$, and $Fe^{2+}$;
  (vii) said metal ion is selected from the group consisting of an ion of Li, Na, K, Rb, Cs, Fr, Mg, Ca, Sr, Ba, Ra, Sc, Y, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, Hg, Al, Ga, In, Tl, Ge, Sn, Pb, As, Sb, Bi, Se, and Te;
  (viii) said anion is selected from the group consisting of cyanide, carbonate, nitrate, nitrite, phosphate, phosphite, sulfide, sulfphate, sulphite, chloride, bromide, iodide, fluoride, and a derivative thereof;
  (ix) said organic cation is a quaternary ammonium compound of the formula $N(R')_4^+$, wherein R' each independently is H, or $C_1$-$C_{10}$ alkyl; and
  (x) said gas is selected from the group consisting of CO, $CO_2$NO, $Cl_2$, $Br_2$, He, Ne, and Ar.

28. A method for performing a logic operation in a logic circuit such that predetermined inputs to the logic circuit produce a logical output according to said logic operation, the method comprising the steps of:
- selecting a plurality of predetermined solid-state molecular chips, each molecular chip comprising a layer of an active compound confined to a solid support, each molecular chip having multiple states, each state being obtained after application of a corresponding input, each state being read electrically, optically, electrochemically or any combination thereof;
- wherein said active compound on at least one of said molecular chips is different from said active compound on at least another of said molecular chips;
- applying a plurality of predetermined inputs,
- such that after applying said predetermined inputs on said predetermined molecular chips, reading the states of said plurality of molecular chips produces a logical output according to said logic operation.

29. A method for the detection of inputs to a logic circuit performing a logic operation, the method comprising the steps of:
- selecting a plurality of predetermined solid-state molecular chips, each molecular chip comprising a layer of an active compound confined to a solid support, each molecular chip having multiple states, each state being obtained after application of a corresponding input, each state being read electrically, optically, electrochemically or any combination thereof;
- wherein said active compound on at least one of said molecular chips is different from said active compound on at least another of said molecular chips;
- reading the states of said plurality of molecular chips after application of said inputs; and
- calculating a logical output based on the states of said plurality of molecular chips,
- such that knowing the logical output which can only be obtained after application of predetermined inputs on said plurality of molecular chips produces the detection of said inputs.

* * * * *